(12) United States Patent
Shimizu et al.

(10) Patent No.: US 7,795,945 B2
(45) Date of Patent: Sep. 14, 2010

(54) SIGNAL PROCESS CIRCUIT, LEVEL-SHIFTER, DISPLAY PANEL DRIVER CIRCUIT, DISPLAY DEVICE, AND SIGNAL PROCESSING METHOD

(75) Inventors: Shinsaku Shimizu, Jiangsu (CN); Tamotsu Sakai, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 43 days.

(21) Appl. No.: 12/225,929

(22) PCT Filed: Mar. 7, 2007

(86) PCT No.: PCT/JP2007/054468

§ 371 (c)(1),
(2), (4) Date: Oct. 2, 2008

(87) PCT Pub. No.: WO2007/135799

PCT Pub. Date: Nov. 29, 2007

(65) Prior Publication Data

US 2009/0051403 A1    Feb. 26, 2009

(30) Foreign Application Priority Data

May 24, 2006    (JP) .............................. 2006-144712

(51) Int. Cl.
*H03L 5/00* (2006.01)
(52) U.S. Cl. ............................. 327/333; 326/81; 326/63
(58) Field of Classification Search ............. 326/62–63, 326/80–81; 327/306, 333
See application file for complete search history.

(56) References Cited

U.S. PATENT DOCUMENTS 5,471,149 A    11/1995    Usuki (Continued)

FOREIGN PATENT DOCUMENTS

JP    50/151433 A    12/1975

(Continued)

OTHER PUBLICATIONS

International Search Report corresponding to International Patent Application No. PCT/JP2007/054468.

*Primary Examiner*—Dinh T. Le
(74) *Attorney, Agent, or Firm*—Harness, Dickey & Pierce, P.L.C.

(57) ABSTRACT

In one embodiment of the present invention, a signal process circuit in accordance with the present invention includes: a first input terminal via which an input signal is supplied; a second input terminal via which a predetermined signal is supplied; a cross-coupled inverter circuit, including first and second CMOS inverter circuits, in which an input of the first CMOS inverter circuit and an output of the second CMOS inverter circuit are interconnected to each other and an output of the first CMOS inverter circuit and an input of the second CMOS inverter circuit are interconnected to each other; a current control circuit that applies currents to the first and second CMOS inverter circuits in accordance with a timing signal, the input signal, and the predetermined signal; output terminals which are connected to the outputs of the first and second CMOS inverter circuits, respectively, and from which an output signal is supplied; and a reset circuit that resets the output signal based on the timing signal. With the arrangement, it is possible to cause a signal of a small amplitude to be level-shifted and latched at low power consumption.

17 Claims, 22 Drawing Sheets

U.S. PATENT DOCUMENTS

| | | | | |
|---|---|---|---|---|
| 6,107,853 | A | * | 8/2000 | Nikolic et al. ............... 327/217 |
| 6,366,113 | B1 | * | 4/2002 | Song ........................... 326/24 |
| 6,369,632 | B1 | * | 4/2002 | Barnes ....................... 327/211 |
| 2005/0007176 | A1 | | 1/2005 | Seki |

FOREIGN PATENT DOCUMENTS

| | | |
|---|---|---|
| JP | 11-308091 | 11/1999 |
| JP | 2004-186955 A | 7/2004 |
| JP | 2005-150989 | 6/2005 |

* cited by examiner

US 7,795,945 B2

SIGNAL PROCESS CIRCUIT, LEVEL-SHIFTER, DISPLAY PANEL DRIVER CIRCUIT, DISPLAY DEVICE, AND SIGNAL PROCESSING METHOD

TECHNICAL FIELD

The present invention relates to a signal process circuit (e.g., a level-shifter) for use in a driver of a display device and the like.

BACKGROUND ART

A level-shifter is adopted in a driver (a source driver) of a display panel so as to increase amplitude of a signal supplied outside the display panel. Patent documents 1 and 2 are well known documents that disclose arrangements of such a level-shifter.

FIG. 22(a) is a circuit diagram illustrating a circuit configuration of the level-shifter disclosed in the Patent document 1. A level-shifter 110 illustrated in FIG. 22(a) includes: an IN terminal via which an input signal IN is supplied; an INB terminal via which an inversion signal INB of the input signal is supplied; an OUT terminal via which an output signal OUT is supplied; an OUTB terminal via which an inversion signal OUTB of the output signal is supplied; a CMOS inverter circuit 101 including a P-channel MOS transistor 103 (a load transistor) and an N-channel MOS transistor 104 (a driver transistor); a CMOS inverter circuit 102 including a P-channel MOS transistor 105 (a load transistor) and an N-channel MOS transistor 106 (a driver transistor); and two P-channel MOS transistors 107 and 108.

A source of the MOS transistor 107 is connected to a high electric potential side power source (Vdd); a drain of the MOS transistor 107 is connected to a source of the MOS transistor 103; and a gate of the MOS transistor 107 is connected to an output of the CMOS inverter circuit 102.

A source of the MOS transistor 108 is connected to the high electric potential side power source (Vdd); a drain of the MOS transistor 108 is connected to a source of the MOS transistor 102; and a gate of the MOS transistor 108 is connected to an output of the CMOS inverter circuit 101.

Sources of the MOS transistors 104 and 106 are connected to the low electric potential side power source (Vss); an input of the CMONS inverter circuit 101 and the IN terminal are interconnected to each other; an output of the CMOS inverter circuit 101 and the OUTB terminal are interconnected to each other; an input of the CMOS inverter circuit 102 and the INB terminal are interconnected to each other; and an output of the CMOS inverter circuit 102 and the OUT terminal are interconnected to each other.

If, for example, (i) the input signal IN is "H" (Vcc) and (ii) the input inversion signal INB is "L" (Vss) in the level-shifter 110, then the P-channel MOS transistor 103 in the CMOS inverter circuit 101 is capable of supplying a smaller current than the P-channel MOS transistor 105 in the second CMOS inverter circuits; and the N-channel MOS transistor 104 of the CMOS inverter circuit 101 is turned ON, while the N-channel transistor 106 of the CMOS inverter circuit 102 is turned OFF. This causes electric potential of the OUTB terminal to become lower than that of the OUT terminal. As a result, the P-channel MOS transistor 107 supplies a less current than the P-channel MOS transistor 108, so that the electric potential of the OUTB further decreases to be ultimately equal to electric potential of the Vss. This causes the P-channel MOS transistor 107 to be turned OFF whereas the P-channel MOS transistor 108 to be turned ON, thereby resulting in that the electric potential of the OUT terminal becomes equal to that of the Vdd.

Thus, when an input signal is "H" (Vcc), the input signal is level-shifted, so that a signal of Vdd is outputted (see FIGS. 22(b) and 22(c)).

However, according to the circuit configuration, Vcc has to be greater or equal to a threshold electric potential (Vss+ threshold voltage of the N-channel MOS) of the N-channel MOS transistor, in order for the input signal H (Vcc) to turn on the N-channel MOS transistor 104 in the CMOS inverter circuit 101. As such, the level-shifter disclosed in the Patent document 1 cannot level-shift a small input signal (a signal having a small amplitude) of not more than the threshold electric potential of the N-channel MOS transistor.

Meanwhile, the Patent document 2 discloses an arrangement that allows a level-shift of such a small input signal of not more than a threshold electric potential of the N-channel MOS transistor. According to a level-shifter disclosed in the Patent document 2, an input signal having a small amplitude is biased by a constant current source so as to carry out a level-shift with respect to the input signal having such a small amplitude.

(Patent document 1) Japanese Unexamined Patent Application Publication No. 151433/1975 (Tokukai-sho 50-151433) (published on Dec. 5, 1975)

(Patent document 2) Japanese Unexamined Patent Application Publication No. 308091/1999 (Tokukai-hei 11-308091) (published on Nov. 5, 1999)

DISCLOSURE OF INVENTION

The arrangement disclosed in the Patent document 2, nevertheless, causes a problem that the constant current source generates a steady-state current which increases power consumption.

In a circuit such as a driver circuit for use in a display device, it is to be noted that a latch operation is executed, in addition to a level-shift operation of a signal. As such, a latch circuit should be separately provided, if the level-shifters disclosed in the Patent documents 1 and 2 are used in such a driver circuit.

The present invention is attained in view of the problem, and an object of the present invention is to provide a signal process circuit that (i) level-shifts and latches a signal having a small amplitude so as to generate an output signal and (ii) realizes lower power consumption.

In order to attain the object, the signal process circuit in accordance with the present invention is arranged to include: a first input terminal via which an input signal is supplied; a second input terminal via which a predetermined signal is supplied; a cross-coupled inverter circuit, including first and second CMOS inverter circuits, in which (i) an input of the first CMOS inverter circuit and an output of the second CMOS inverter circuit are interconnected to each other and (ii) an output of the first CMOS inverter circuit and an input of the second CMOS inverter circuit are interconnected to each other; and a current control circuit (i) that is connected to a first power source and to the first and second input terminals and (ii) that applies currents to the first and second CMOS inverter circuits in accordance with the input signal and the predetermined signal, wherein: (i) the input of the first CMOS inverter circuit is connectable to the first input terminal, while the input of the second CMOS inverter circuit is connectable to the second input terminal; (ii) the input of the first CMOS inverter circuit is connectable to the second power source, while the input of the second CMOS inverter circuit is also connectable to the second power source; or (iii) the inputs of the first and second CMOS inverter circuits are inter-connectable to each other; and an output signal is generated at the output of the first CMOS inverter circuit or at the output of the second CMOS inverter circuit.

With the signal process circuit of the present embodiment, it is possible to cause the input signal, which is of less than the threshold electric potential of the N-channel MOS transistor in the cross-coupled inverter circuit, to be level-shifted and latched at low power consumption.

The following description deals with an exemplary arrangement in which a first power source is a high electric potential side power source (VDD) and a second power source is a low electric potential side power source (VSS). A load transistor of a first CMOS inverter circuit is referred to as a transistor 3; a driver transistor of the first CMOS inverter circuit is referred to as a transistor 5; a load transistor of a second CMOS inverter circuit is referred to as a transistor 4; and a driver transistor of the second CMOS inverter circuit is referred to as a transistor 6.

In this arrangement, a precondition can be described as follows: an input of the first CMOS inverter circuit is connected to a first input terminal, the low electric potential power source (VSS), or an input of the second CMOS inverter circuit, whereas an input of the second CMOS inverter circuit is connected to a second input terminal, the low electric potential side power source (VSS), or the input of the first CMOS inverter circuit. As such, the transistor 3 applies a less current; the transistor 5 applies a more current; the transistor 4 applies a more current; and the transistor 6 applies a less current.

In this situation, (i) the input of the first CMOS inverter circuit is disconnected from the first input terminal, the low electric potential side power source (VSS), or the input of the second CMOS inverter circuit, (ii) the input of the second CMOS inverter circuit is disconnected from the second input terminal, the low electric potential side power source (VSS), or the input of the first CMOS inverter circuit, and (iii) currents are applied to the first and second inverter circuits in accordance with the input signal and the predetermined signal. If, for example, the input signal is "H" (VCC) and the predetermined signal is "L" (VSS), a large current is supplied to a continuity terminal of the transistor 4, while a small current is supplied to a continuity terminal of the transistor 3.

Since the transistor 4 applies a more current whereas the transistor 6 applies a less current, this causes an electric potential of the output (OUT terminal) of the second CMOS inverter circuit to be increased. On the other hand, since the transistor 3 applies a less current, this causes an electric potential of a control terminal (a gate) of the transistor 4, which is connected to the output of the first CMOS inverter circuit, to be increased more moderately, as compared to that of a control terminal (a gate) of the transistor 3. On this account, the electric potential of the output (OUT terminal) of the second CMOS inverter circuit and the electric potential of the control terminal (the gate) of the transistor 3 connected to the output of the second CMOS inverter circuit rapidly increase. This cause the transistor 3 to stop applying the current, before the transistor 4 stops applying the current.

As a result, all of the current from the high electric potential side power source (VDD) flows into the transistor 4, thereby resulting in that a signal equal to electric potential of the high electric potential side power source (VDD) is supplied via the output (the OUT terminal) of the second CMOS inverter circuit. That is, it is possible to carry out a level-shift, in a full-swing manner up to the electric potential of the high potential side power source (VDD), with respect to the input signal "H" (VCC) of less than threshold electric potential of the N-channel MOS transistor. Note that, even if the signal input is changed from "H" (VCC) to "L" (VSS) in this situation, neither the electric potential of the output (OUT terminal) of the second CMOS inverter circuit nor the electric potential of the control terminal of the transistor 3 connected to the output of the second CMOS inverter circuit changes. This is because the transistor 3 of the first CMOS inverter circuit is turned OFF. That is, the signal, which has been level-shifted to be equal to the electric potential of the high electric potential side power source (VDD), is maintained (the signal is latched).

Further, a current is applied from the high electric potential side power source (VDD) to the cross-coupled inverter circuit only at the time of the level-shift (at the time when VCC is changed into VDD), thereby allowing a reduction in power consumption.

In a signal process circuit of the present embodiment, a current control circuit may include a switch transistor, a first current control transistor, and a second current control transistor, wherein: (i) a control terminal of a first current control transistor is connected to a first input terminal, and a control terminal of a second current control transistor is connected to a second input terminal; and (ii) one of continuity terminals of the first and second current control transistors is connected to a first power source while the switch transistor is turned ON.

A signal process circuit of the present embodiment may include first and second reset switches, wherein: the input of the first CMOS inverter circuit is connected to the first input terminal or the second power source, while the first reset switch is turned ON; the input of the second CMOS inverter circuit is connected to the second input terminal or the second power source, while the second reset switch is turned ON; and the first and second reset switches are turned ON while the switch transistor is turned OFF.

In a signal process circuit of the present embodiment, a predetermined signal may be a constant electric potential signal equal to an electric potential of a second power source. Besides, a predetermined signal may be an inversion signal of an input signal. Furthermore, a predetermined signals may be a constant electric potential signal that is more than a ground electric potential and less than a threshold electric potential of an N-channel MOS transistor (in a range from the ground electric potential to the threshold electric potential of the N-channel MOS transistor). Moreover, a predetermined signal may be a constant electric potential signal that is more than a ground electric potential and less than a maximum electric potential of an input signal.

In a signal process circuit of the present embodiment, a first power source may be a high electric potential side power source; a second power source may be a low electric potential side power source; each of first and second current control transistors and a switching transistor may be made up of an N-channel MOS transistors; and each of first and second reset switches may be made up of a P-channel MOS transistors.

In a signal process circuit of the present embodiment, a first power source may be a low electric potential side power source, and a second power source may be a high electric potential side power source; each of first and second current control transistors and a switching transistor is made up of an N-channel MOS transistors; and each of first and second reset switches may be made up of a P-channel MOS transistors.

A signal process circuit in accordance with the present invention includes: a first input terminal via which an input signal is supplied; a second input terminal via which a predetermined signal is supplied; a cross-coupled inverter circuit, including first and second CMOS inverter circuits, in which (i) an input of the first CMOS inverter circuit and an output of the second CMOS inverter circuit are interconnected to each other and (ii) an output of the first CMOS inverter circuit and an input of the second CMOS inverter circuit are interconnected to each other; a current control circuit (i) that is connected to a first power source and to the first and second input terminals and (ii) that applies currents to the first and second CMOS inverter circuits in accordance with a timing signal, the input signal, and the predetermined signal; an output terminal, connected to the output of the first CMOS inverter circuit or the output of the second CMOS inverter circuit, via which an output signal is outputted; and a reset circuit that resets the output signal in response to the timing signal.

In a signal process circuit of the present embodiment, a current control circuit may include: a switch transistor; a first current control transistor; and a second current control transistor, wherein: (i) a timing signal is supplied to a control terminal of the switch transistor; (ii) a control terminal of the first current control transistor is connected to a first input terminal, and a control terminal of the second current control transistor is connected to a second input terminal; (iii) a first CMOS inverter circuit is connected to the first current control transistor and a second power source; (iv) a second CMOS inverter circuit is connected to the second current control transistor and a second power source; (v) one of continuity terminals of the first and second current control transistors is connected to the first power source while the switch transistor is turned ON in response to the timing signal.

In a signal process circuit of the present embodiment, a predetermined signal may be an inversion signal of an input signal. Alternatively, a predetermined signal may be a constant electric potential signal.

Further, the signal process circuit of the present embodiment is suitable in a case where the input signal has (i) a minimum electric potential equal to an electric potential of the second power source and (ii) a maximum electric potential of less than a threshold electric potential of an N-channel MOS transistor.

In a signal process circuit of the present embodiment, a reset circuit can cause (i) an input of a first CMOS inverter circuit to be connected to a first input terminal and (ii) an input of a second CMOS inverter circuit to be connected to a second input terminal, while a switch transistor is turned OFF. In this case, a predetermined signal can be an inversion signal of an input signal or can be a constant electric potential signal that is more than an electric potential of a second power source and less than an threshold electric potential of an N-channel MOS transistor (in a range from the electric potential of the second power source to the threshold electric potential of the N-channel MOS transistor). Alternatively, in this case, a first current control transistor can have a channel size that is different from that of a second current control transistor; a first CMOS inverter circuit can have a logical threshold level that is different from that of a second CMOS inverter circuit; and a predetermined signal can be a constant electric potential signal equal to an electric potential of the second power source.

In a signal process circuit of the present embodiment, a reset circuit may cause inputs of first and second CMOS inverter circuits to be connected to a second power source while a switch transistor is turned OFF. In this case, a predetermined signal can be an inversion signal of an input signal or a constant electric potential signal that is more than an electric potential of the second power source and less than a maximum electric potential of the input signal. Furthermore, in this case, a first current control transistor can have a channel size that is different from that of a second current control transistor; the first CMOS inverter circuit can have a logical threshold level that is different from that of the second CMOS inverter circuit; and the predetermined signal can be a constant electric potential signal equal to an electric potential of the second power source.

In a signal process circuit of the present embodiment, a reset circuit may cause inputs of first and second CMOS inverter circuits to be interconnected to each other while a switch transistor is turned OFF.

A level-shifter in accordance with the present invention includes a signal process circuit.

A display device in accordance with the present invention includes a display panel and a display panel driver circuit. In this case, the display panel and the display panel driver circuit can be monolithically formed.

A signal processing method in accordance with the present invention is arranged such that an input signal is level-shifted and latched, with use of a signal process circuit. In this case, the processing method can arranged such that the input signal is outputted, as it is, as an output signal, before the input signal is subjected to the level shift; and the level-shift is carried out from a level of the input signal while the level-shift is carried out.

As such, with the signal process circuit in accordance with the present invention, it is possible to cause the input signal of less than the threshold electric potential of the N-channel MOS transistor to be level-shifted and latched at low power consumption.

REFERENCE NUMERALS

Figure 1:
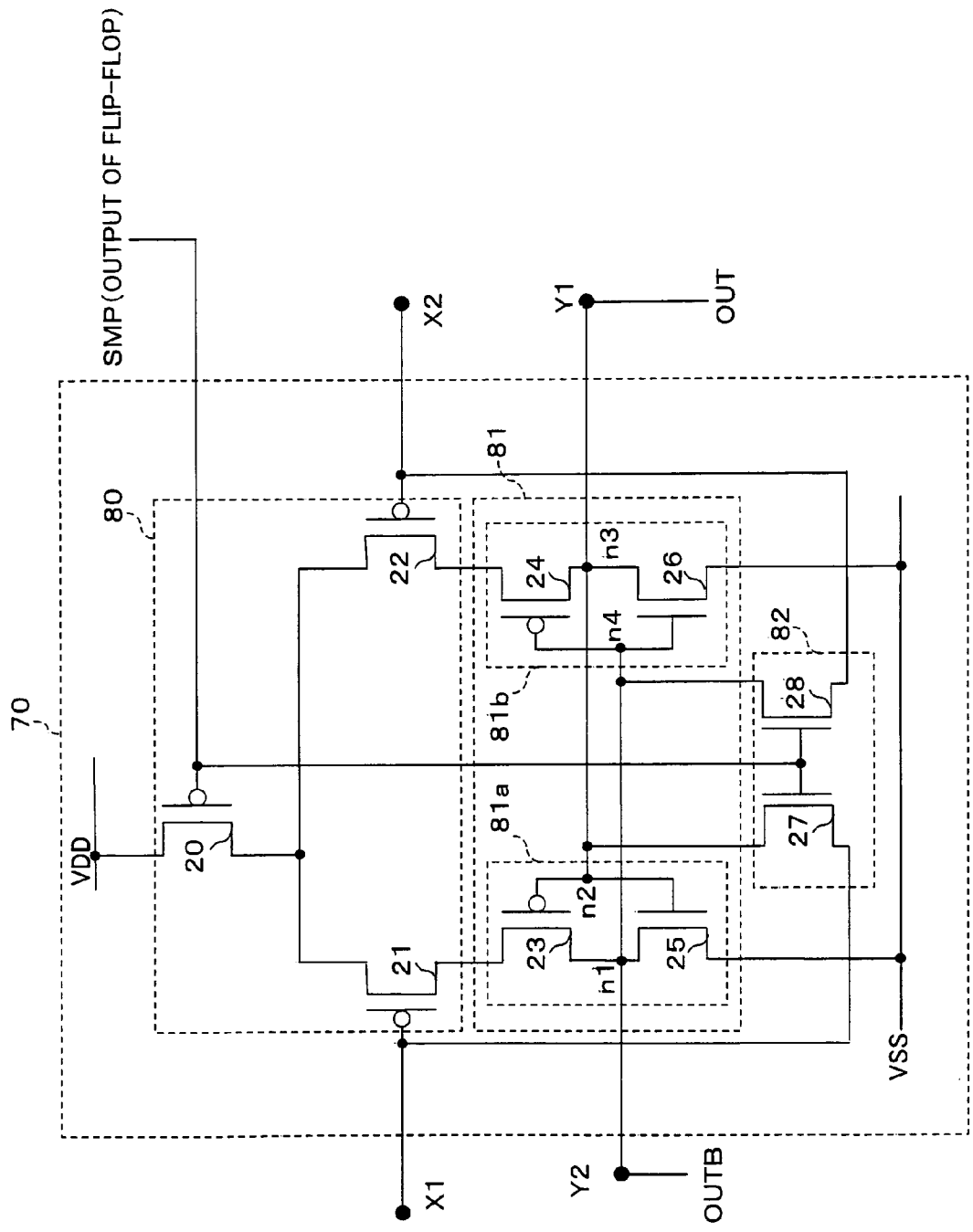
FIG. 1 is a circuit diagram illustrating a circuit configuration of a level-shifter latch circuit of the present embodiment.
Figure 2:
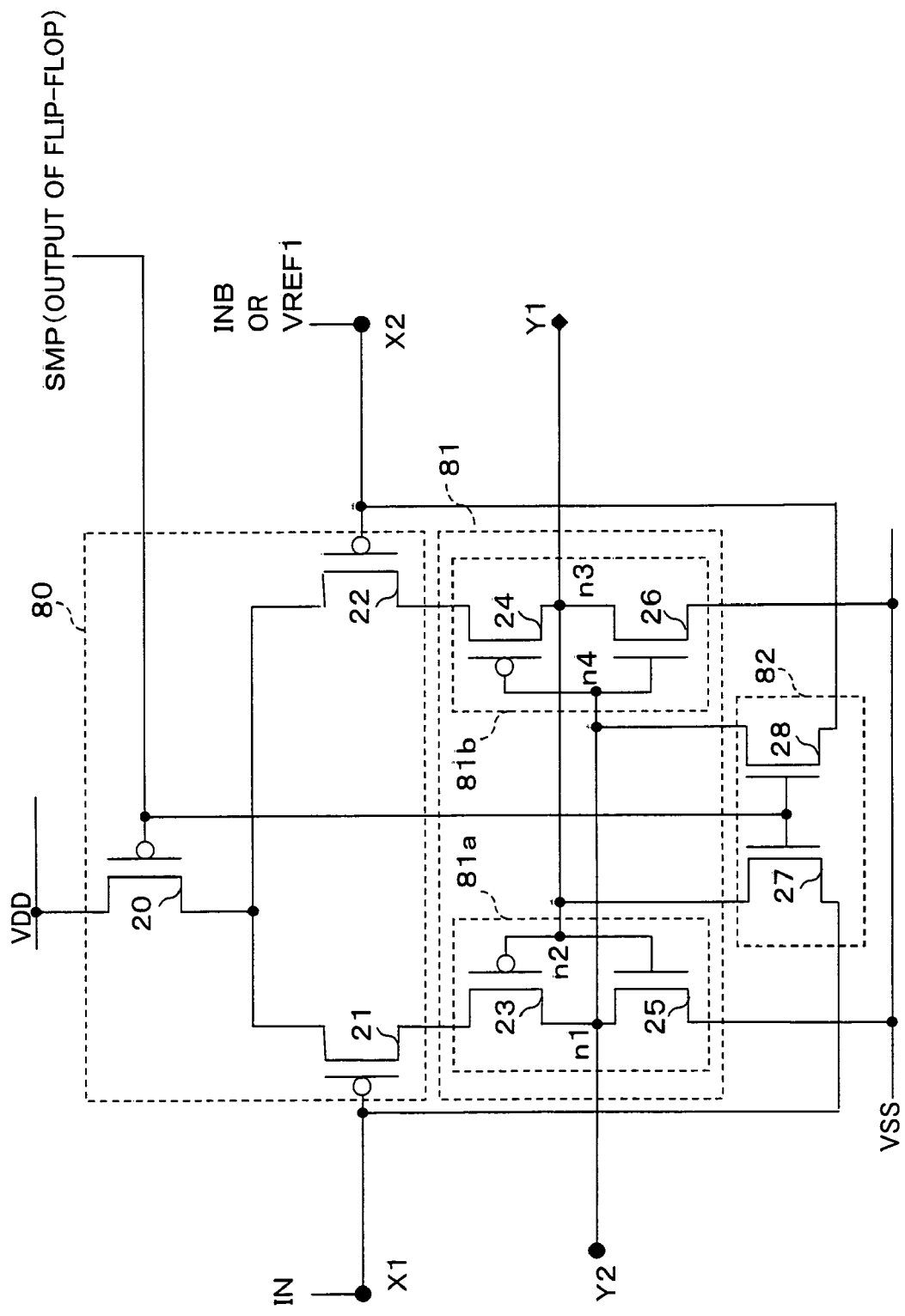
FIG. 2 is a circuit diagram illustrating a circuit configuration of the level-shifter latch circuit of the present embodiment.

10. Liquid crystal display device
30. Display section
40. Gate driver
70. Level-shifter latch circuit (signal process circuit)
80. Current control circuit
81. Cross-coupled inverter circuit
82. Reset circuit
90. Source driver (display panel driver circuit)

BEST MODE FOR CARRYING OUT THE INVENTION

Figure 14:
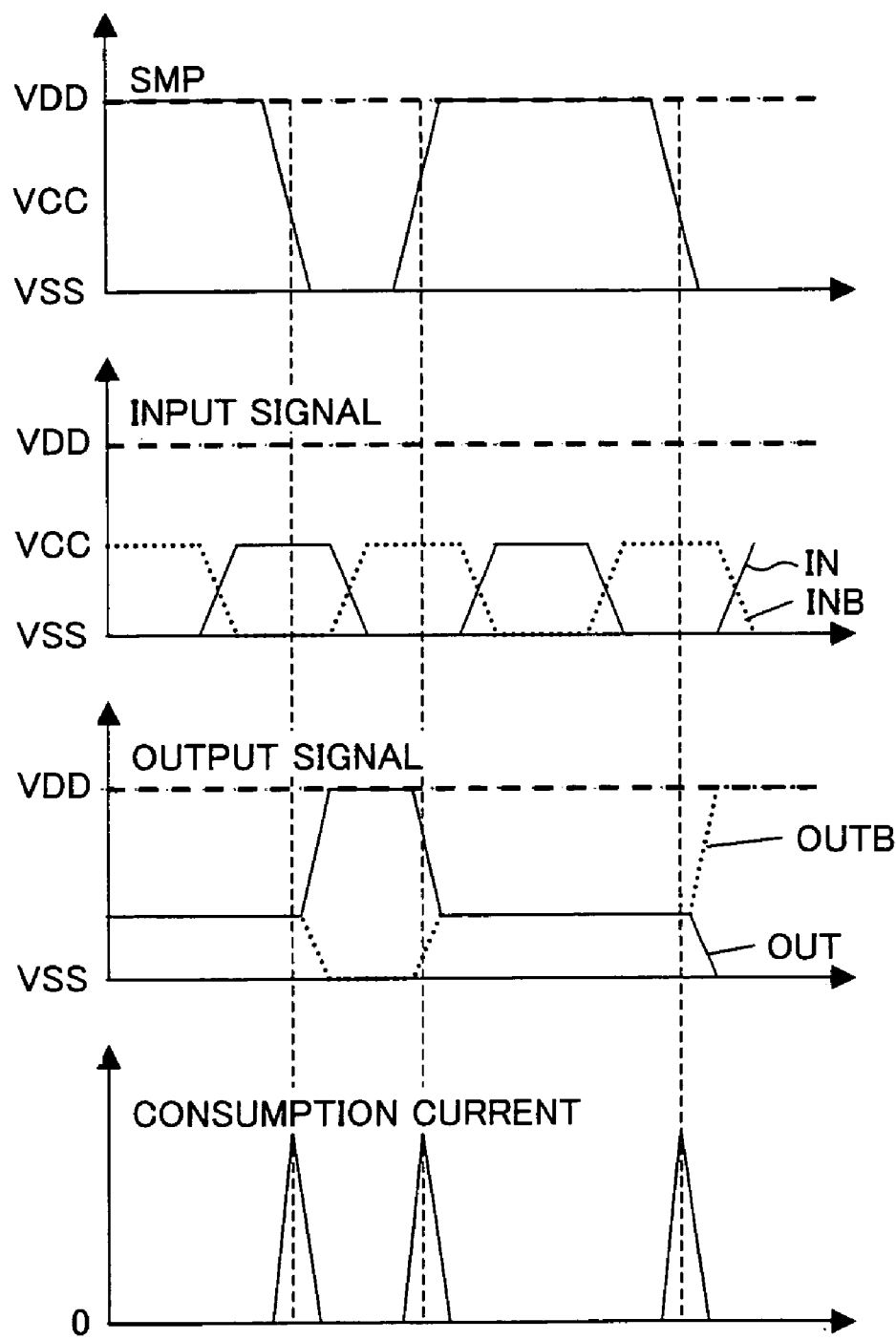
FIG. 14 is a timing chart describing how the level-shifter latch circuit in FIG. 7 operates.
Figure 15:
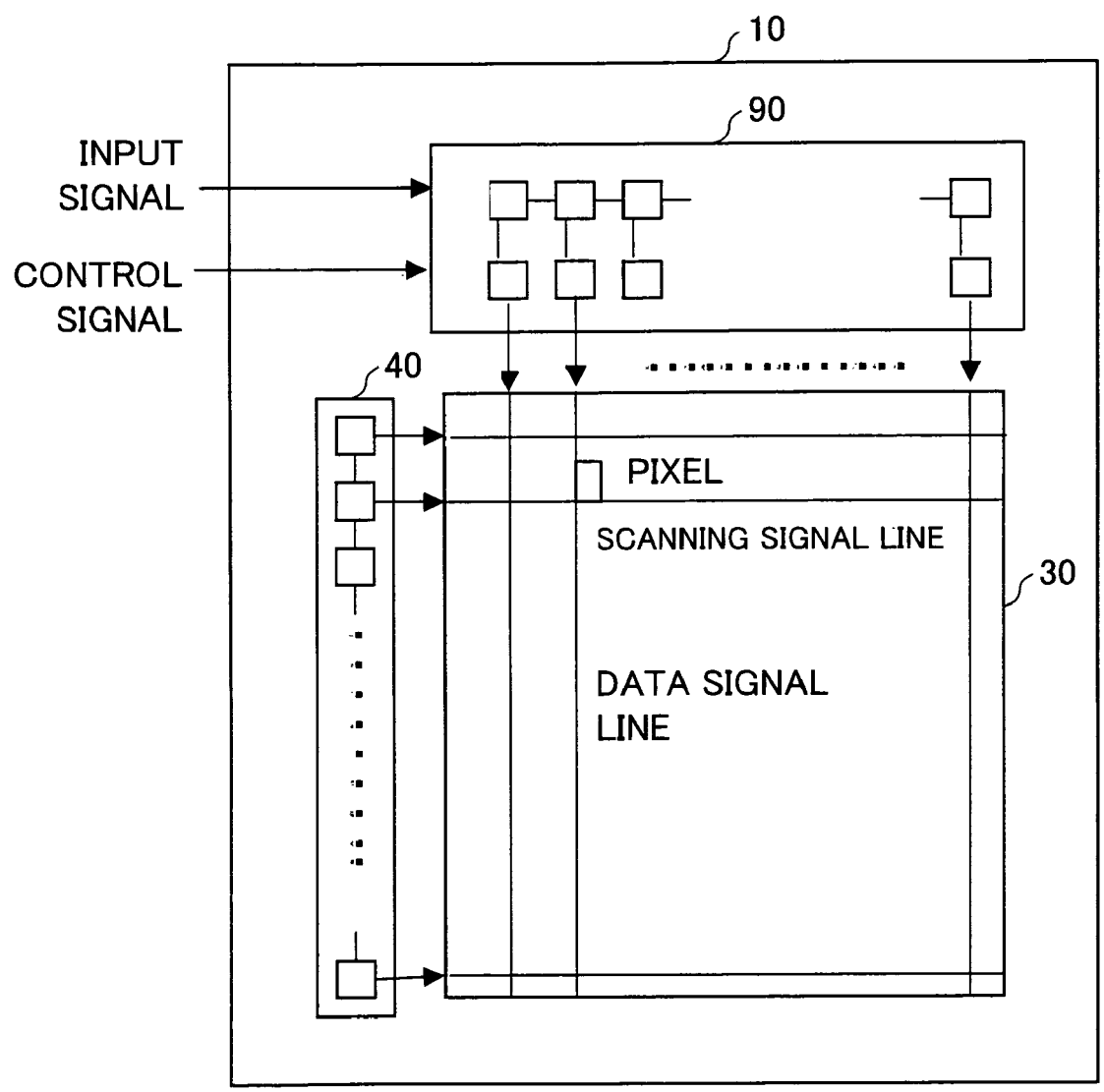
FIG. 15 is a schematic view illustrating an arrangement of a liquid crystal display device of the present embodiment.

The following describes a present embodiment with reference to FIGS. 1 through 20. FIG. 15 is a block diagram illustrating an arrangement of a liquid crystal display device in accordance with a present embodiment. As illustrated in FIG. 15, a liquid crystal display device 10 of the present embodiment includes a display section 30, a gate driver 40, and a source driver 90. The display section 30, the gate driver 40, and the source driver 90 are provided on a single substrate so as to constitute a so-called system on panel. To the source driver 90, an input signal (image data) and various control signals are supplied. The display section 30 is provided with pixels in the vicinity of intersections between a plurality of scanning signal lines extending in a row (lateral) direction and a plurality of data signal lines extending in a column (longitudinal) direction, respectively.

Figure 16:
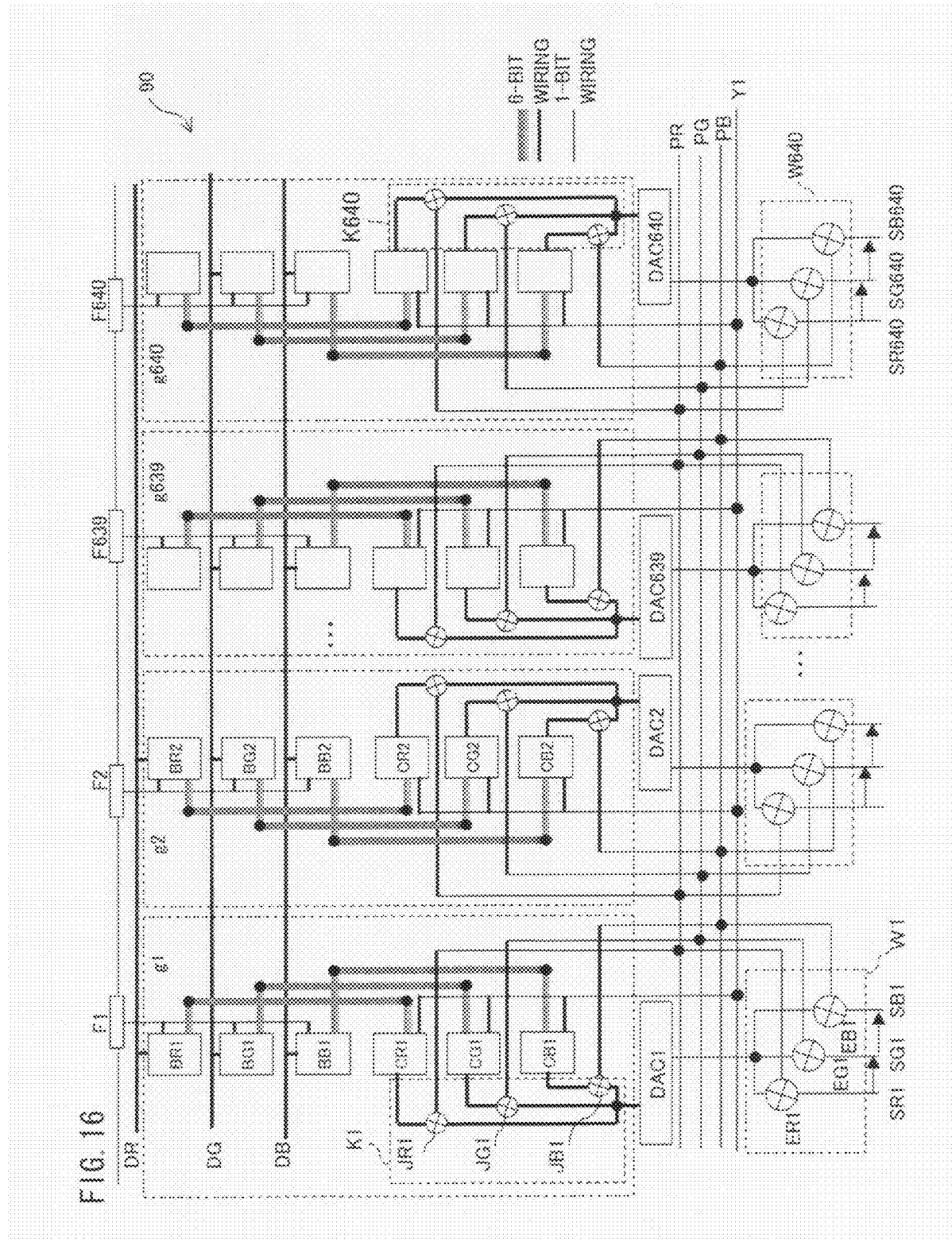
FIG. 16 is a circuit diagram illustrating a circuit configuration of a digital driver of the present embodiment.

FIG. 16 is a circuit diagram illustrating a circuit configuration of a source driver 90 of a liquid crystal display device in accordance with the present embodiment. The source driver 90 is a digital driver that (i) generates analogue signal electric potentials based on a digital input signal (e.g., 6 bits) supplied outside the panel and (ii) supplies the analogue signal electric potentials to the data signal lines of the display section 30.

As illustrated in FIG. 16, the digital driver 90 includes a plurality of signal process blocks (not illustrated), three input signal lines DR, DG, and DB, three switch control lines PR, PG, and PB, and a single latch pulse line Y1.

Each of the signal process blocks includes a single flip-flop F (which is provided within a shift register), a single circuit block g, a single DAC, and a single time-sharing switch block W. Each of the signal process blocks receives three data signal lines SR, SG, and SB from the display section. Each of the time-sharing switch blocks W includes three analogue switches ER, EG, and EB.

Each of the circuit blocks g includes: three latch blocks BR, BG, and BB provided in a column direction; three latch blocks CR, CG, and CB, provided in a row direction, by which the three latch blocks BR, BG, and BB are followed; and a single selection switch block K.

Each of the latch blocks BR, BG, and BB includes six first latch circuits (signal process circuits), and each of the latch blocks CR, CG, and CB includes six second latch circuits, neither of which are illustrated. As illustrated in FIG. 16, the selection switch block K includes three switch circuits JR, JG, and JB. Each of the selection switch circuits JR, JG, and JB includes switching elements corresponding to 6 bits that correspond to the latch blocks CR, CG, and CB. It follows that the selection switch block K includes switching elements corresponding to 18 bits.

For example, a first signal process block includes a flip-flop F1, a circuit block g1, a DAC1, and a time-sharing switch block W1, and corresponds to three data signal lines SR1, SG1, and SB1. The time-sharing switch block W1 includes three analogue switches ER1, EG1, and EB1. The circuit block g1 includes; three latch blocks BR1, BG1, and BB1; three latch blocks CR1, CG1, and CB1 by which the three latch blocks BR1, BG1, and BB1 are followed; and a selection switch block K1. The selection switch block K1 includes three switch circuits JR1, JG1, and JB1.

Figure 18:
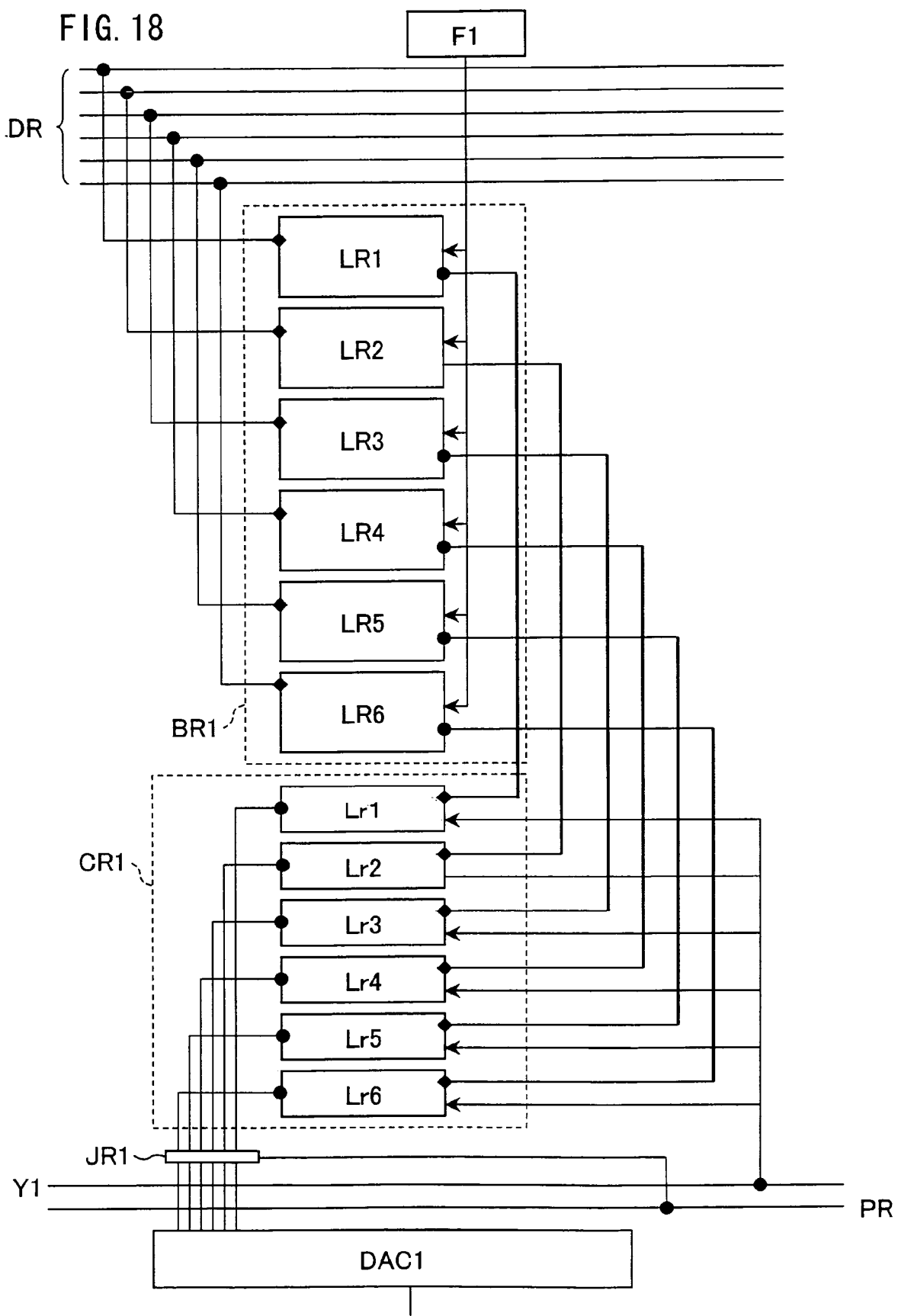
FIG. 18 is a circuit diagram illustrating a circuit configuration of a signal process block provided to the digital driver of the present embodiment.

As illustrated in FIG. 16, the latch blocks BR, BG, and BB are connected to the flip-flop F, the input signal lines SR, SG, and SB and the latch blocks CR, CG, and CB, respectively. The latch blocks CR, CG, and CB are connected to the DAC via the switch circuits JR, JG, and JB, respectively and are connected to the single latch pulse line Y1. FIG. 18 illustrates a connection relation between the latch block BR1 and the respective latch block CR1 by which the latch block BR1 is followed.

As illustrated in FIG. 18, all of the six first latch circuits LR1 through LR6 in the latch block BR1 are connected to the respective flip-flop F1 in a shift register. Besides, the first latch circuits LR1 through LR6 are connected to wirings (1-bit wiring) of the input signal wirings DR (6-bit wiring), respectively. Further, the first latch circuits LR1 through LR6 are connected to second latch circuits of the latch block CR1, respectively. For example, the first latch circuit LR1 is connected to the second latch circuit Lr1, and the first latch circuit LR6 is connected to the second latch circuit Lr6. On the other hand, all of the second latch circuits Lr1 through Lr6 are connected to the latch pulse line Y1, and are also connected to a DAC1, via the respective switch circuit JR1.

Also, the three switch circuits (JR, JG, and JB) of the selection switch block K are connected to switch control lines (PR, PG, and PB), respectively. For example, the switch circuit JR1 of the selection switch block K1 is connected to the switch control line PR; the switch circuit JG1 is connected to the switch control line PG; and the switch circuit JB1 is connected to the switch control line PB.

The DACs are connected to the three data signal lines SR, SG, and SB via the time-sharing switch blocks W, respectively. For example, the DAC1 is connected to the data signal lines SR1, SG1, and SB1 via the time-sharing switch block W1.

Further, the three analogue switches (ER, EG, and EB) of the time-sharing switch blocks W are connected to the switch control lines (PR, PG, and PB), respectively, and to the data signal lines (SR, SG, and SB), respectively.

For example, the analogue switch ER1 of the time-sharing switch block W1 is connected to the switch control line PR and to the data signal line SR1; the analogue switch EG1 is connected to the switch control line PG and to the data signal line SG1; and the analogue switch EB1 is connected to the switch control line PB and to the data signal line SB1.

Thus, for example, red (R) signal processing is dealt with by the latch block BR connected to a red input signal line DR, the latch block CR, the switch circuit JR, the DAC, and the analogue switch ER. Then, the analogue signal thus processed is supplied to a red data signal line SR. This is also true for cases of green (G) signal processing and blue (B) signal processing. Each of the DACs deal with the red, green, and blue signal processing in a time-shared manner.

Figure 19:
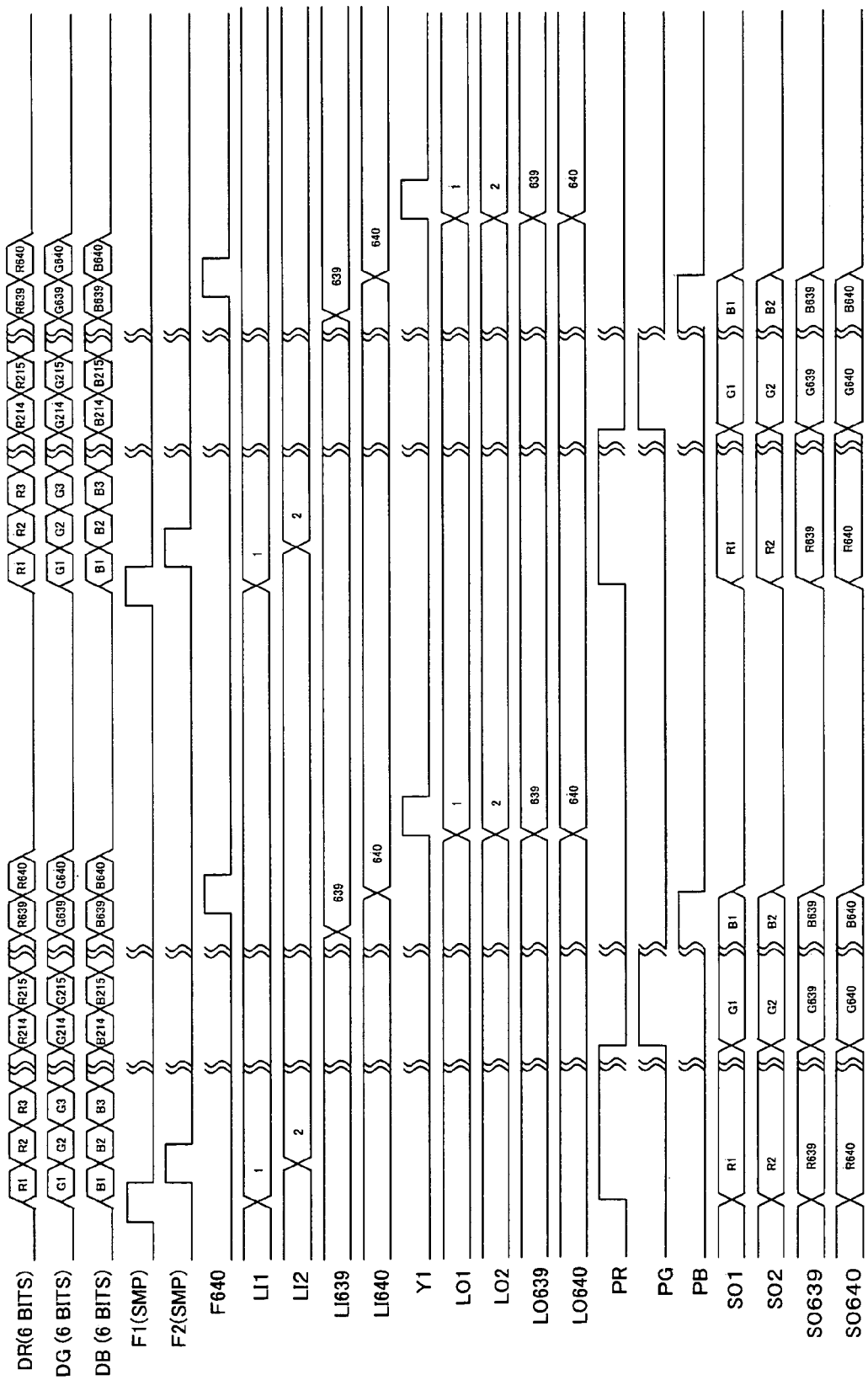
FIG. 19 is a timing chart describing how the digital driver of the present embodiment operates.
Figure 20:
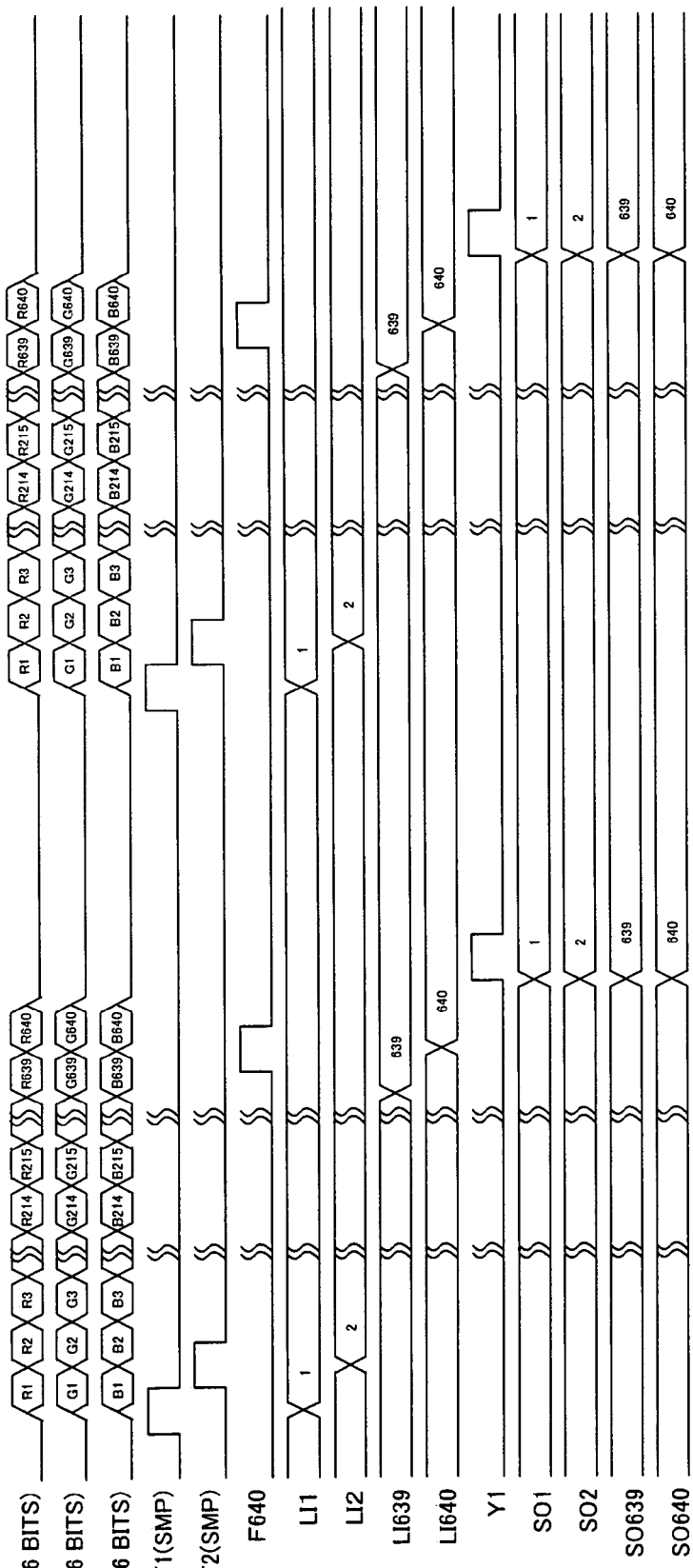
FIG. 20 is a timing chart describing how the level-shifter latch circuit of the present embodiment operates.

FIG. 19 is a timing chart showing a signal processing flow carried out in the digital driver 90. Here, R1 through R640 are 6-bit input signal data that corresponds to data signal lines SR1 through SR640; G1 through G640 are 6-bit input signal data that corresponds to data signal lines SG1 through SG640; and B1 through B640 are 6-bit input signal data that corresponds to data signal lines SB1 through SB640. Besides, an output signal of the latch block BR is indicated by L1; an output signal of the posterior latch block CR is indicated by LO; and an output signal of the selection switch circuit is indicated by SO.

The latch blocks BR1, BG1, and BB1 latch (and level-shift) the input signals R1, G1, and B1, respectively at a timing when an output pulse (SMP) of the flip-flop F1 is changed from High to Low (active). Likely, as output pulses F2 through F640 are sequentially changed from High to Low, input signals (R2 through R640, G2 through G640, and B2 through B640) are sequentially latched (and level-shifted), respectively. Level-shift function and latch function of the latch blocks BR, BG, and BB are dealt with later.

On completion of the latch (and the level-shift) of all the input signals R2 through R640, G2 through G640, and B2 through B640, an output pulse of the latch pulse line Y1 becomes High. This causes all of the input signals R2 through R640, G2 through G640, and B2 through B640, which have been latched by the latch blocks BR, BG, BB, to be latched by the latch blocks CR, CG, and CB, respectively.

Successively, at a timing when an output pulse of the switch control line PR is changed into High, all of the switch circuits (JR1 through JR640) connected to the switch control line PR are simultaneously turned ON, and the input signals (R1 through R640) are supplied to the DACs (DAC1 through DAC640). This causes the input signals (R1 through R640) to be converted into analogue signal electric potential (Ra1 through Ra640), respectively. The switch control line PR is also connected to the analogue switches ER, respectively. All of the analogue switches (ER1 through ER640) connected to the switch control line PR are simultaneously turned ON, at a timing when the output pulse of the switch control line PR is changed into High. This causes signal electric potential (Ra1 through Ra640) to be supplied to the data signal lines (SR1 through SR640), respectively, via the analogue switches thus turned ON.

Then, at a timing when the output pulse of the switch control line PG is changed into High, all of the switch circuits (JG1 through JG640) connected to the switch control line PG are simultaneously turned ON, and the input signals (G1 through G640) are supplied to the DACs (DAC1 through DAC640). This causes the input signals (G1 through G640) to be converted into analogue signal electric potential (Ga1 through Ga640), respectively. The switch control line PG is also connected to the analogue switches EG, respectively. All of the analogue switches (EG1 through EG640) connected to the switch control line PG are simultaneously turned ON, at a timing when the output pulse of the switch control line PG is changed into High. This causes signal electric potential (Ga1 through Ga640) to be supplied to the data signal lines (SG1 through SG640), respectively, via the analogue switches thus turned ON.

Subsequently, at a timing when an output pulse of the switch control line PB is changed into High, all of the switch circuits (JB1 through JB640) connected to the switch control line PB are simultaneously turned ON, and the input signals (B1 through B640) are supplied to the DACs (DAC1 through DAC640). This causes the input signals (B1 through B640) to be converted into analogue signal electric potential (Ba1 through Ba640), respectively. The switch control line PB is also connected to the analogue switches EB, respectively. All of the analogue switches (EB1 through EB640) connected to the switch control line PB are simultaneously turned ON, at a timing when the output pulse of the switch control line PB is changed into High. This causes signal electric potential (Ba1 through Ba640) to be supplied to the data signal lines (SB1 through SB640), respectively, via the analogue switches thus turned ON.

Figure 17:
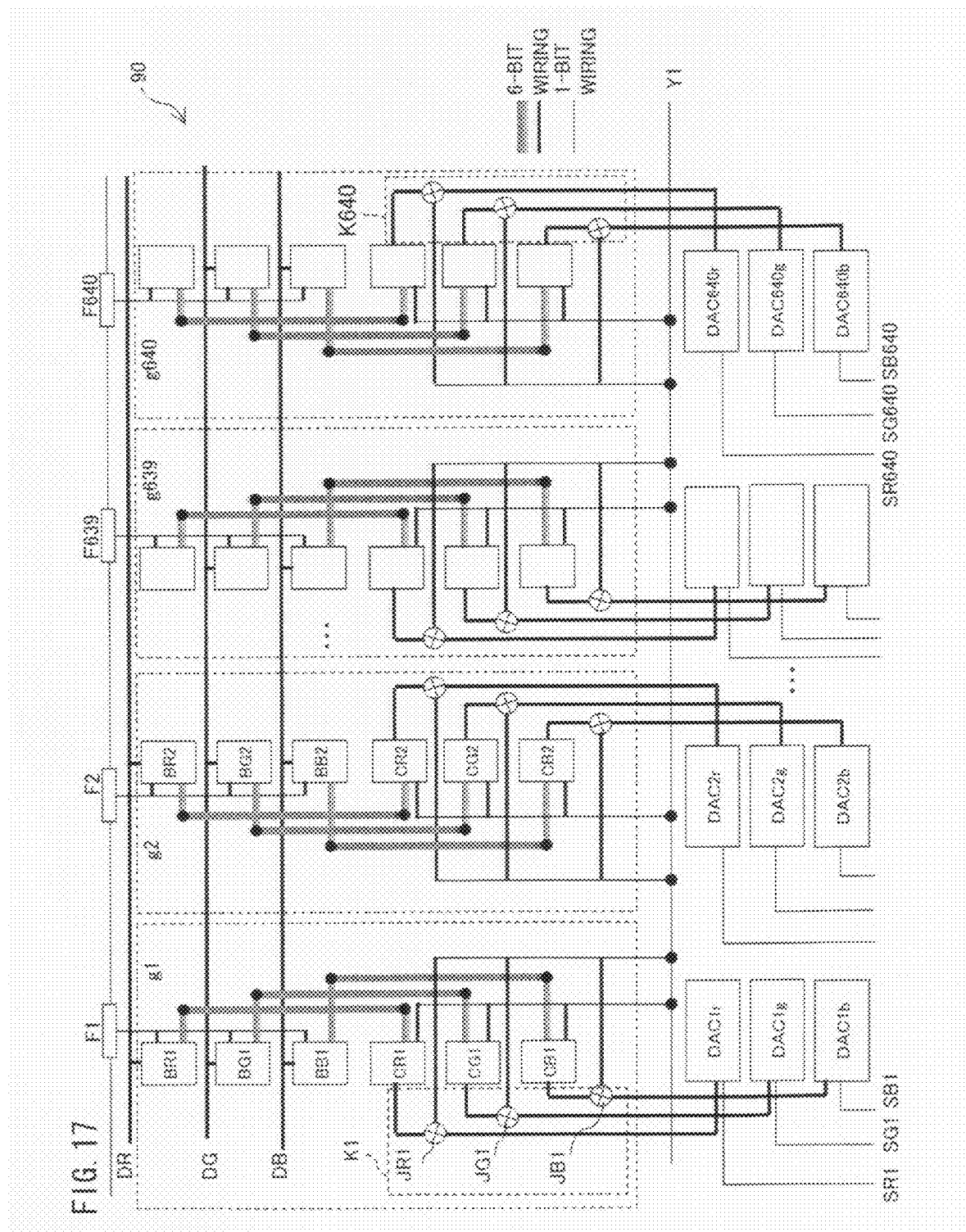
FIG. 17 is a circuit diagram illustrating a circuit configuration of a digital driver of the present embodiment.

As an alternative, a digital driver 90 may also be arranged as illustrated in FIG. 17, i.e., may be arranged so that the time-sharing switch circuits (W1 through W640) and the three switch control lines PR, PG, and PB are eliminated from the arrangement shown in FIG. 16, whereas three DACs are provided for the signal process blocks (g1 to g640), respectively.

In the arrangement in FIG. 17, a signal process block corresponds to a single flip-flop, a single selection switch circuit, three DACs, and three data signal lines of a display section 30. For example, a signal process block g1 corresponds to a flip-flop F1, a selection switch K1, DAC1r, 1g, and 1b, and three data signal lines SR1, SG1, and SB1. The signal process block g1 includes latch blocks BR1, BG1, and BB1 and latch blocks CR1, CG1, and CB1 by which the latch blocks BR1, BG1, and BB1 are followed, respectively. The selection switch circuit K1 includes switch circuits JR1, JG1, and JB1.

The latch block CR1 is connected to the DAC1r via the switch circuit JR1; the latch block CG1 is connected to the DAC1g via the switch circuit JG1; and the latch block CB1 is connected to the DAC1b via the switch circuit JB1.

A single latch pulse line Y1 is connected to the latch blocks CR1, CG1, and CB1 and to the switch circuits JR1, JG1, and JB1 are also connected. A signal processing flow of the digital driver in FIG. 17 is as illustrated in the timing chart in FIG. 20.

By arranging a first latch circuit (hereinafter, referred to as a level-shifter latch circuit) of the latch blocks BR, BG, and BB as illustrated in FIGS. 1 through 8, it is possible for the present embodiment to carry out level-shifting and latching, at low power consumption, with respect to an input signal of less than a threshold electric potential of the N-channel MOS transistor. The following description deals with this.

FIG. 1 is a circuit diagram illustrating a circuit configuration of the level-shifter latch circuit in accordance with the present embodiment. As FIG. 1 illustrates, a level-shifter latch circuit 70 of the present embodiment includes a first input terminal X1, a second input terminal X2, a first output terminal Y1, a second output terminal Y2, a current control circuit 80, a cross-coupled inverter circuit 81, and a reset circuit 82.

The current control circuit 80 includes three P-channel MOS transistors 20, 21, and 22. The cross-coupled inverter circuit 81 includes two P-channel MOS transistors 23 and 24 and two N-channel MOS transistors 25 and 26. The reset circuit 82 includes two N-channel MOS transistors 27 and 28.

The cross-coupled inverter circuit 81 (i) includes a first CMOS inverter circuit 81a having the transistors 23 and 25 and a second CMOS inerter circuit 81b having the transistors 24 and 26; and (ii) is arranged so that (a) an input of the first CMOS inverter circuit 81a and an output of the second CMOS inverter circuit 81b are interconnected to each other and (β) an output of the first CMOS inverter circuit 81a and an input of the second CMOS inverter circuit 81b are interconnected to each other. That is, (i) sources of the transistors 25 and 26 are connected to VSS; (ii) drains of the transistors 23 and 25 are interconnected to each other at a node n1, while gates of the transistors 23 and 25 are interconnected to each other at a node n2; (iii) drains of the transistors 24 and 26 are interconnected to each other at a node n3, while gates of the transistors 24 and 26 are interconnected to each other at a node n4; and (iv) the second output terminal Y2 and the nodes n1 and n4 are interconnected to each other, while the nodes n2 and n3 and the first output terminal Y1 are interconnected to each other.

In the current control circuit 80, a gate of the transistor 20 is connected to an output of a flip-flop; a gate of the transistor 21 is connected to the first input terminal X1; a gate of the transistor 22 is connected to the second input terminal X2; a source of the transistor 20 is connected to VDD; and a drain of the transistor 20 and sources of the transistors 20 and 21 are interconnected to each other. Further, a drain of the transistor 21 is connected to a source of the transistor 23, while a drain of the transistor 22 is connected to a source of the transistor 24. With the arrangement, the current control circuit 80 controls currents applied to the first and second CMOS inverter circuits 81a and 81b in accordance with an output (SMP) of the flip-flop and signals supplied via the first and second input terminals X1 and X2.

In the reset circuit 82, gates of the transistors 27 and 28 are connected to the outputs of the flip-flop. Two continuity terminals of the transistor 27 are connected to the first input terminal X1 and the first output terminal Y1, respectively. Two continuity terminals of the transistor 28 are connected to the second input terminal X2 and the second output terminal Y2, respectively.

Figure 9:
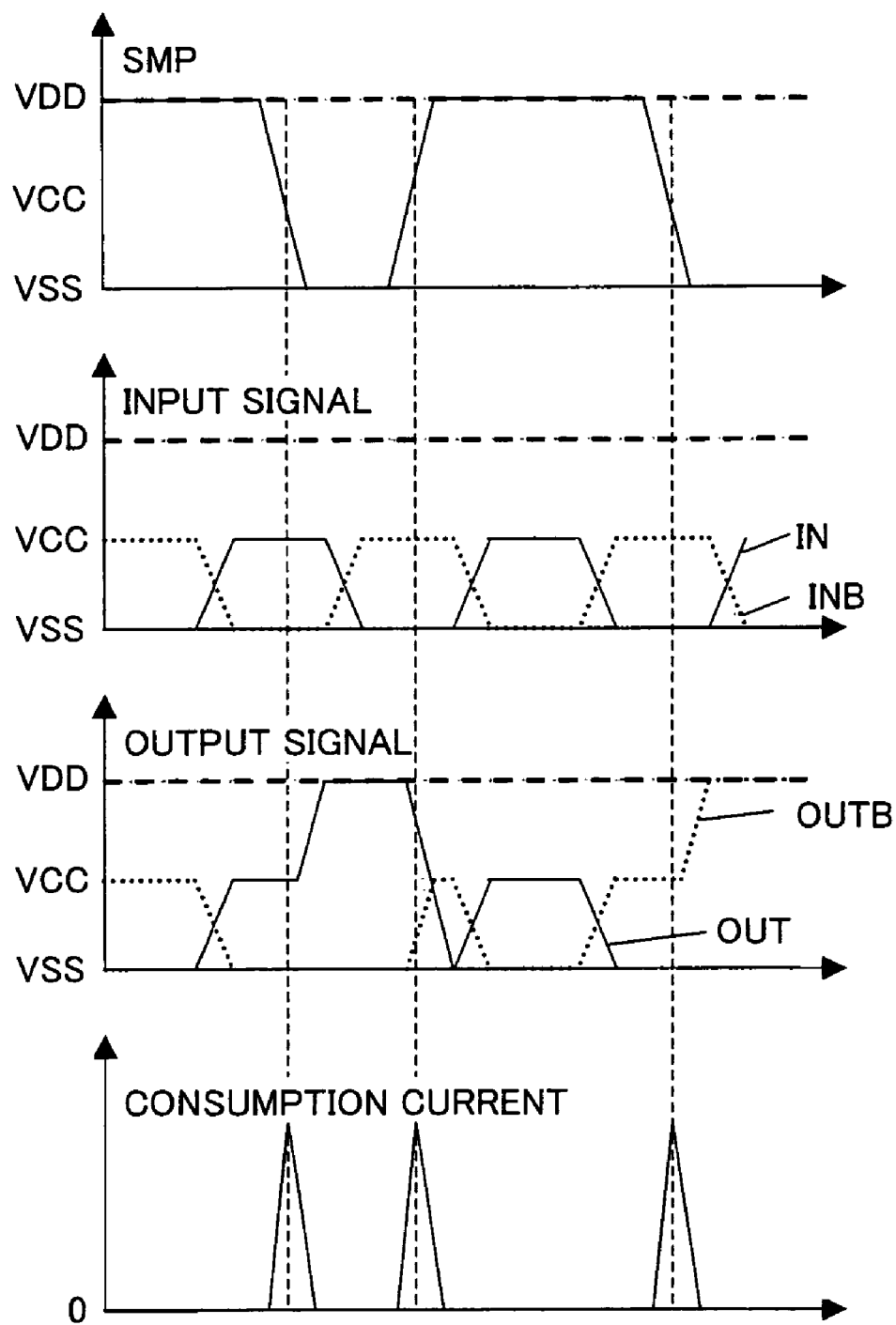
FIG. 9 is a timing chart describing how the level-shifter latch circuit in FIG. 1 operates.

When the first and second input terminals X1 and X2 receive an IN (a first input signal) and an INB (a second input signal, i.e., a inversion signal of the IN), respectively, as shown in FIG. 9, signals indicated by OUT and an OUTB as shown in FIG. 9 are generated at the first and second output terminals Y1 and Y2, respectively. The following description deals with this.

For example, in a case where the SMP, IN, and INB in FIG. 9 are inactive "H (VDD)," "H (VCC)," and "L (VSS)," respectively, the transistor 20 is turned OFF, whereas the transistors 27 and 28 are turned ON. Thus, VCC is supplied to the gates of the transistors 21, 23, and 25 via the X1, while VSS is supplied to the gates of the transistors 22, 24, and 26 via the X2. This causes (i) the transistors 21 and 23 to apply a less current, while the transistor 25 applies a more current and (ii) the transistors 22 and 24 to apply a more current, while the transistor 26 applies less a current.

When the SMP shown in FIG. 9 is changed into an active "L," the transistor 20 is turned ON, whereas the transistors 27 and 28 are turned OFF. As described above, the transistor 21 is more likely to apply the current, while the transistor 22 is more likely to apply the current.

Therefore, a small current is applied to the first CMOS inverter circuit 81a from the high electric potential side power source VDD, whereas a large current is applied to the second CMOS inverter circuit 81b from the high electric potential side power source VDD.

Further, in the CMOS inverter circuits, the transistor 23 applies the less current; the transistor 25 applies the more current; the transistor 24 applies the more current; and the transistor 26 applies the less current. As such, electric potential of the output terminal (n3) of the second CMOS inverter circuit 81b rapidly increases, whereas electric potential of the gate of the transistor 24 connected to the output (n1) of the first CMOS inverter circuit 81a moderately increases, as compared to gate electric potential of the transistor 23. This causes a current to be continuously applied to the transistor 24 whereas transistor 23 is gradually turned OFF. On this account, no current is ultimately applied to the first CMOS inverter circuit 81a.

As a result, electric potential of the output (n3) of the second CMOS inverter circuit 81b becomes equal to the electric potential of the high electric potential side power source (VDD), thereby resulting in that a signal "VDD" is outputted via the first output terminal Y1 (see FIG. 9). That is, it is possible to carry out a level-shift, in a full-swing manner up to the electric potential of the high electric potential side power source (VDD), with respect to the input signal "H (VCC)" of less than the threshold electric potential of the N-channel MOS transistor. Note that, even if the signal input is changed from "H (VCC)" to "L (VSS)" in this situation, neither the electric potential of the output terminal (n3) of the second CMOS inverter circuit 81b nor the electric potential of the gate of the transistor 23 connected to the output terminal (n3) of the second CMOS inverter circuit 81b changes, as shown in FIG. 9. This is because the transistor 23 of the first CMOS inverter circuit 81a is turned OFF. That is, the signal, which has been level-shifted to be equal to the high electric potential side power source (VDD), is latched.

Further, as shown in FIG. 9, a current is supplied to the cross-coupled inverter circuit 81 only at beginning and ending of the level-shifted (at the time when "H"/"L" of the SMP is changed). This allows a reduction in power consumption.

Further, as shown in FIG. 9, the inactive SMP causes the input signal to be supplied as it is, thereby causing VCC to be level-shifted to VDD when carrying out a level-shift with respect to the input signal "H." This allows speed up of the level shift operation.

Figure 13:
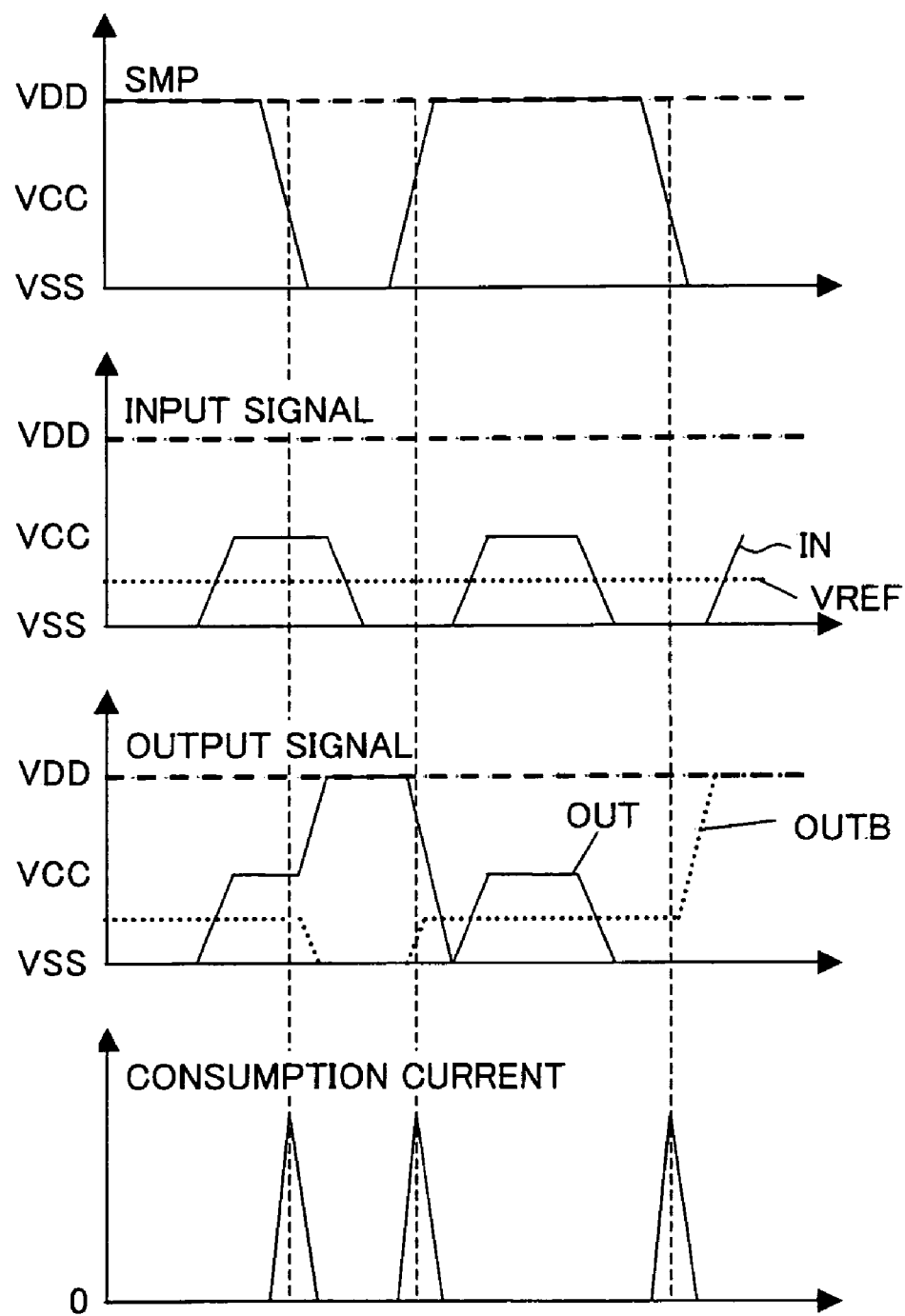
FIG. 13 is a timing chart describing how the level-shifter latch circuit in FIG. 2(b) operates.

Note that it is also possible to supply a constant electric potential signal VREF 1, as a second input signal, (see FIG. 2) to the second input terminal X2 of the level-shifter latch circuit (see FIG. 1). In this case, the VREF 1 is assumed to be positive electric potential of less than the threshold electric potential of the N-channel MOS transistor. This causes a generation of output signals indicated by OUT and OUTB (see FIG. 13) at the first and second output terminals Y1 and Y2, thereby allowing the input signal to be level-shifted and latched. Besides, as shown in FIG. 13, a current is applied only at beginning and ending of the level-shift (at the time when the "H"/"L" of the SMP is changed), thereby allowing a reduction in power consumption.

Figure 3:
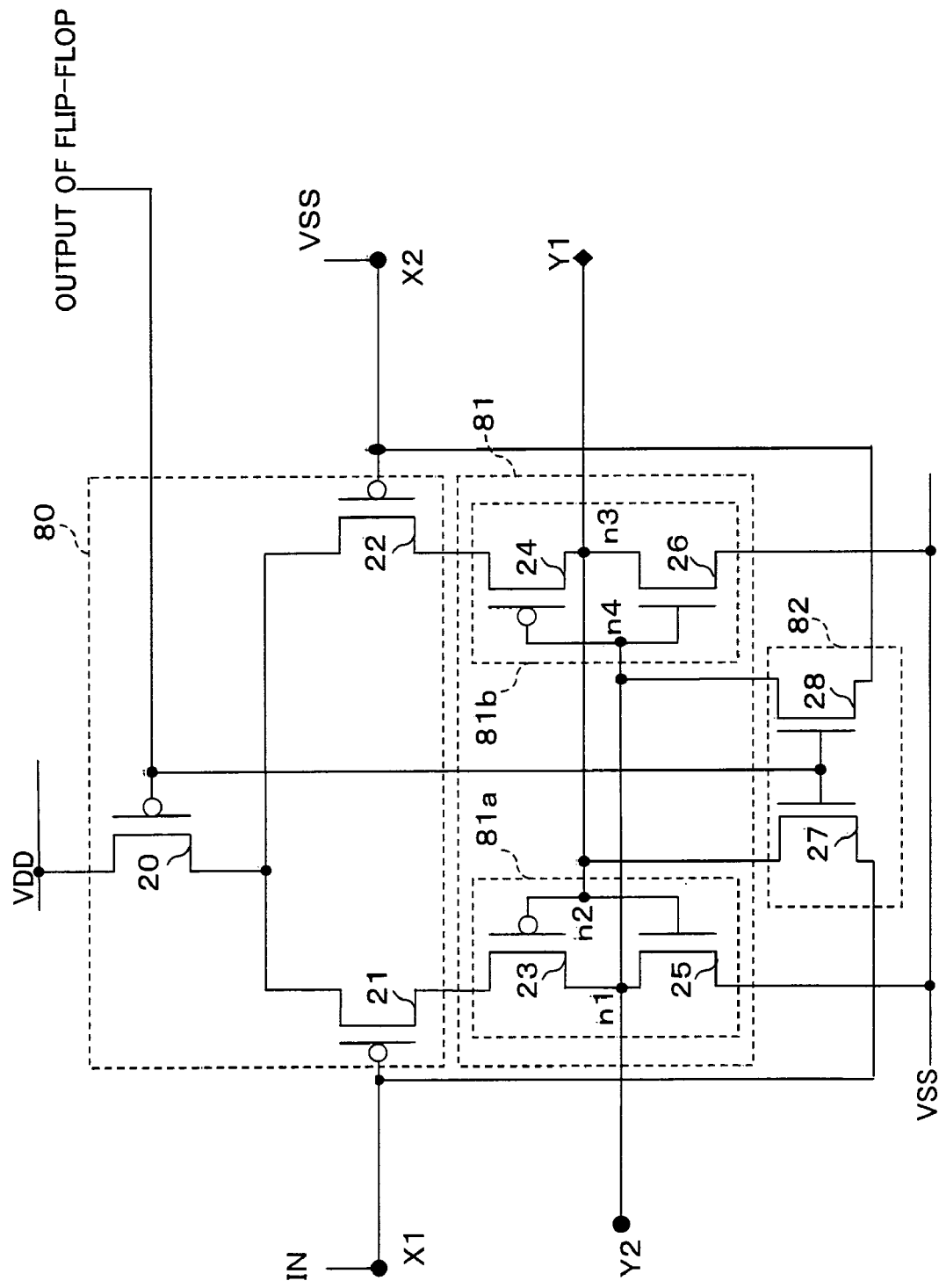
FIG. 3 is a circuit diagram illustrating a circuit configuration of the level-shifter latch circuit of the present embodiment.
Figure 10:
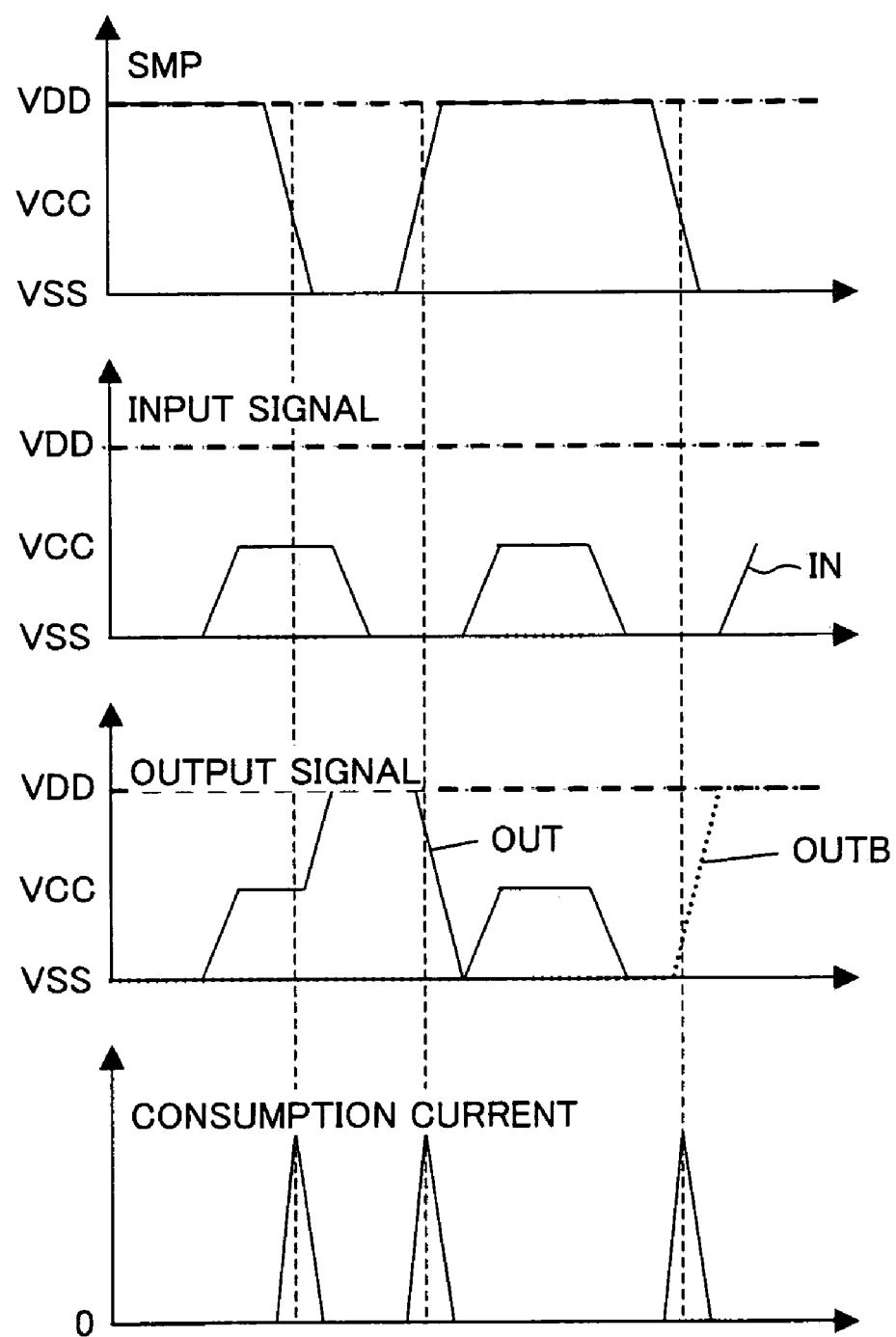
FIG. 10 is a timing chart describing how the level-shifter latch circuit in FIG. 3 operates.

Alternatively, it is also possible to supply, as a second input signal, a constant signal VSS to the second input terminal X2 shown in FIG. 1 (see FIG. 3). In this case, (i) a channel width/channel length (a ratio of the channel width to the channel length) of the transistor 21 is set to be larger than that of the transistor 22; and (ii) a logical threshold level of the first CMOS inverter circuit 81a is set to be larger than that of the second CMOS inverter circuit 81b. This causes a generation of output signals indicted by OUT and OUTB in FIG. 10 at the first and second output terminals Y1 and Y2, thereby allowing the input signal to be level-shifted and latched. Besides, as shown in FIG. 10, a current is applied only at beginning and ending of the level-shift (at the time when "H"/"L" of the SMP is changed), thereby allowing a reduction in power consumption. It is preferable to set an a value such that i21 (VCC)=α×i22(VCC)<i22(VSS) and I21(VSS)= α×i22(VSS)>i22(VSS) (i.e., 1<α<i22(VSS)/i22(VCC)), where, in the arrangement in FIG. 3, (i) α indicates a ratio of (a channel width/length (a ratio of the channel width to the channel length) of a transistor 21):(a channel width/length (a ratio of the channel width to the channel length) of a transistor 22), (ii) i21(v) indicates a current applied to the transistor 21 at the time when X1 is v, and (iii) i22(v) indicates of a current applied to the transistor 22 at the time when X2 is v.

Figure 21:
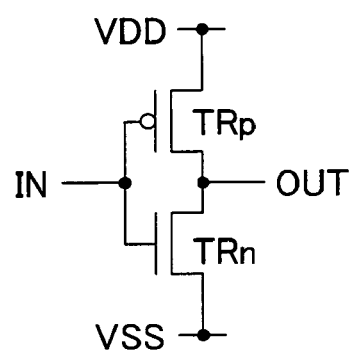
FIG. 21(a) is a circuit diagram illustrating a circuit configuration of a CMOS inverter circuit.
FIG. 21(b) is a graph for describing a logical threshold level of the CMOS inverter circuit illustrated in FIG. 21(a).
Figure 21:
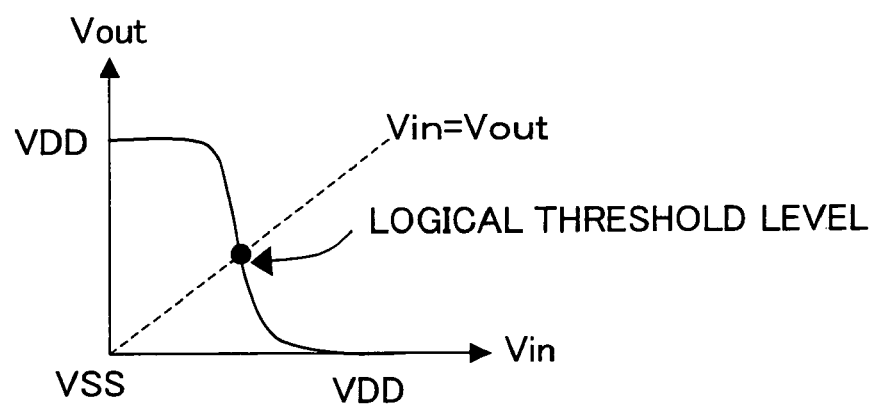
Figure 22A:
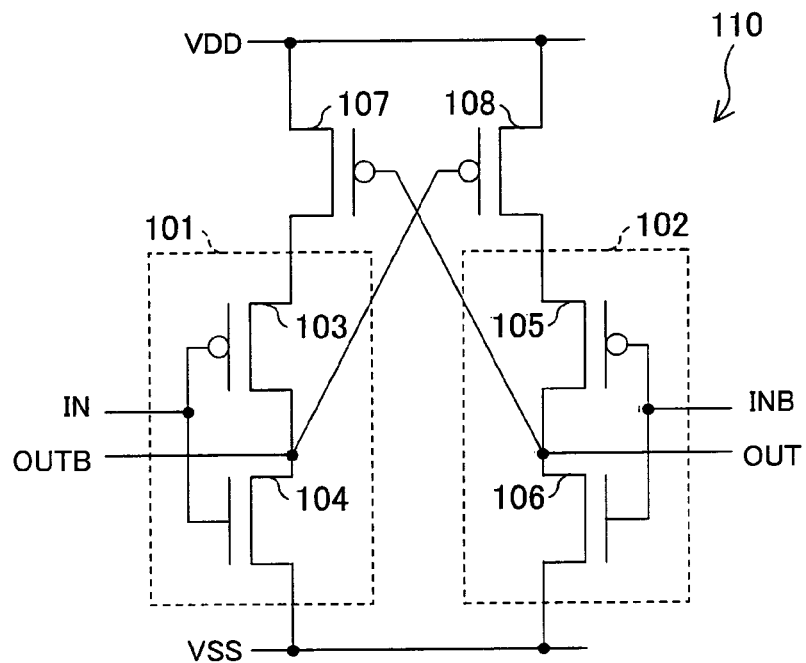
FIG. 22(a) is a circuit diagram illustrating a circuit configuration of a conventional level-shifter.
Figure 22B:
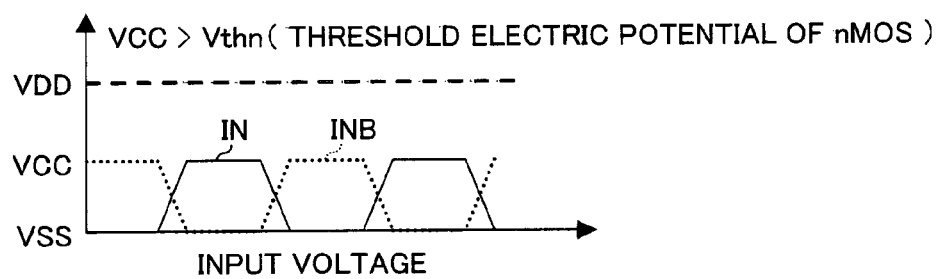
FIG. 22(b) is a timing chart describing how the conventional level-shifter illustrated in FIG. 22(a) operates (inputting).
Figure 22C:
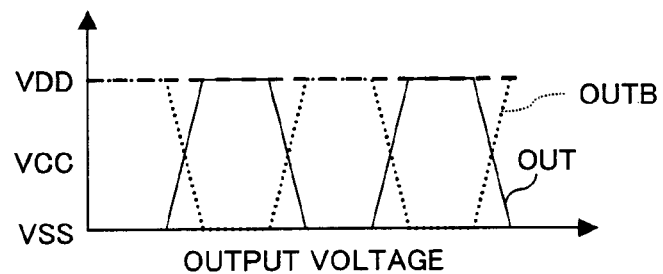
FIG. 22(c) is a timing chart describing how the conventional level-shifter illustrated in FIG. 22(a) operates (outputting).

A logical threshold level is an input value at an intersection point of (i) a curve, which is indicative of an input/output relation (an input $V_{in}$ and an output $V_{out}$) in the CMOS inverter circuit and (ii) a straight line of $V_{in}=V_{out}$. FIG. 21 (b) shows a relation between (i) a voltage $V_{in}$ that is supplied via an IN terminal and (ii) a voltage $V_{out}$ that is supplied via an OUT terminal in a CMOS inverter circuit (a logical gate that supplies, via the OUT terminal, an inversion of logic supplied via the IN terminal) illustrated in FIG. 21(a). When a voltage $V_{in}$ is equal to VSS, a transistor $TR_p$ is turned ON while a transistor $TR_n$ is turned OFF, thereby causing a voltage $V_{out}$ to be equal to VDD. On the other hand, when the voltage $V_{in}$ increases to be more than a threshold level of the transistor $TR_n$, the transistor $TR_n$ is turned ON while the voltage $V_{out}$ starts to gradually decrease and ultimately reaches the VSS. Generally, the term the logical threshold level refers to an input (= an output) at the intersection point of (i) the curve indicative of the input/output relation of the CMOS inverter circuit illustrated in FIG. 21b and (ii) the straight line of $V_{in}=V_{out}$.

Figure 4:
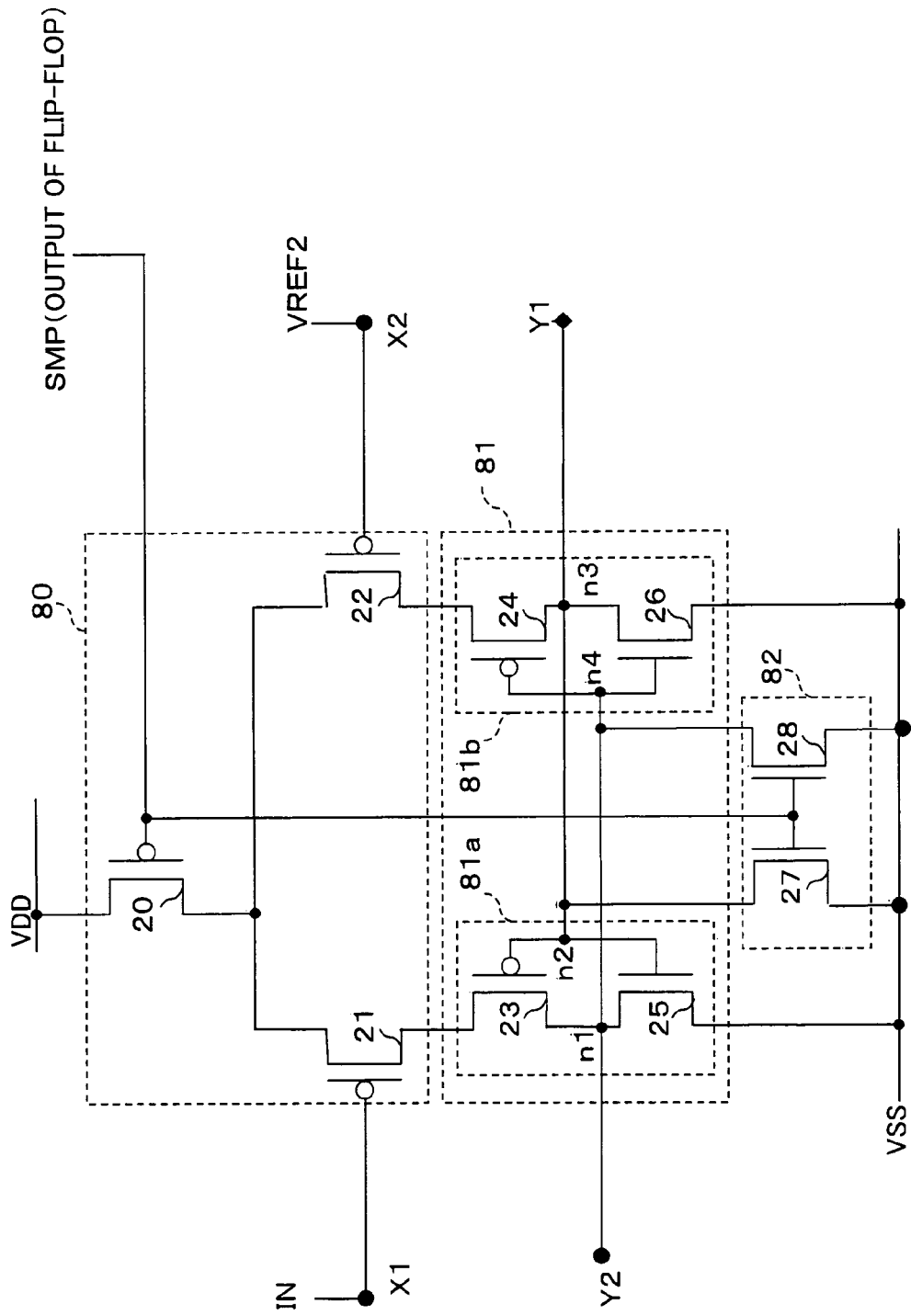
FIG. 4 is a circuit diagram illustrating a circuit configuration of the level-shifter latch circuit of the present embodiment.
Figure 11:
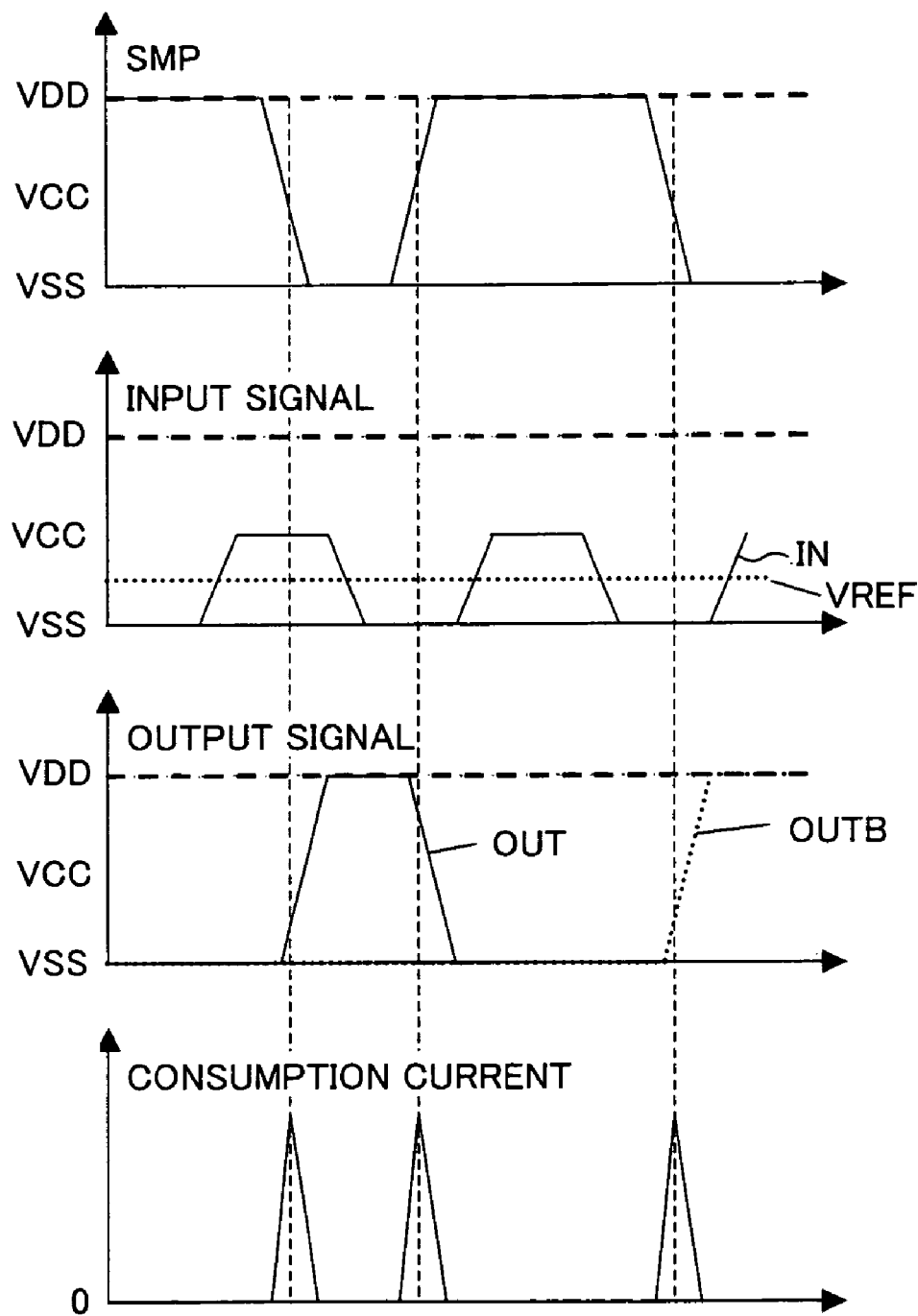
FIG. 11 is a timing chart describing how the level-shifter latch circuit in FIG. 4 operates.

A level-shifter latch circuit of the present embodiment may be arranged as shown in FIG. 4. That is, in a reset circuit 82, two continuity terminals of a transistor 27 are connected to VSS and to a first output terminal Y1, respectively, while two continuity terminals of a transistor 28 are connected to VSS and to a second output terminal Y2, respectively. Arrangements other than specified above are the same as those shown in FIG. 1. A constant electric potential signal VREF 2 is supplied to a second input terminal X2, where the VREF 2 is assumed to be positive electric potential that is less than VCC. This causes a generation of output signals indicated by OUT and OUTB in FIG. 11, at the first and second output terminals Y1 and Y2, respectively, thereby allowing an input signal to be level-shifted and latched. Besides, as shown in FIG. 11, a current is applied only at beginning and ending of the level-shift (at the time when the "H"/"L" of the SMP is changed), thereby allowing a reduction in power consumption. Furthermore, as shown in FIG. 11, according to the circuit configuration in FIG. 4, it is possible to fix the output signals to VSS, while the SMP is inactive (at a time of a reset).

Figure 7:
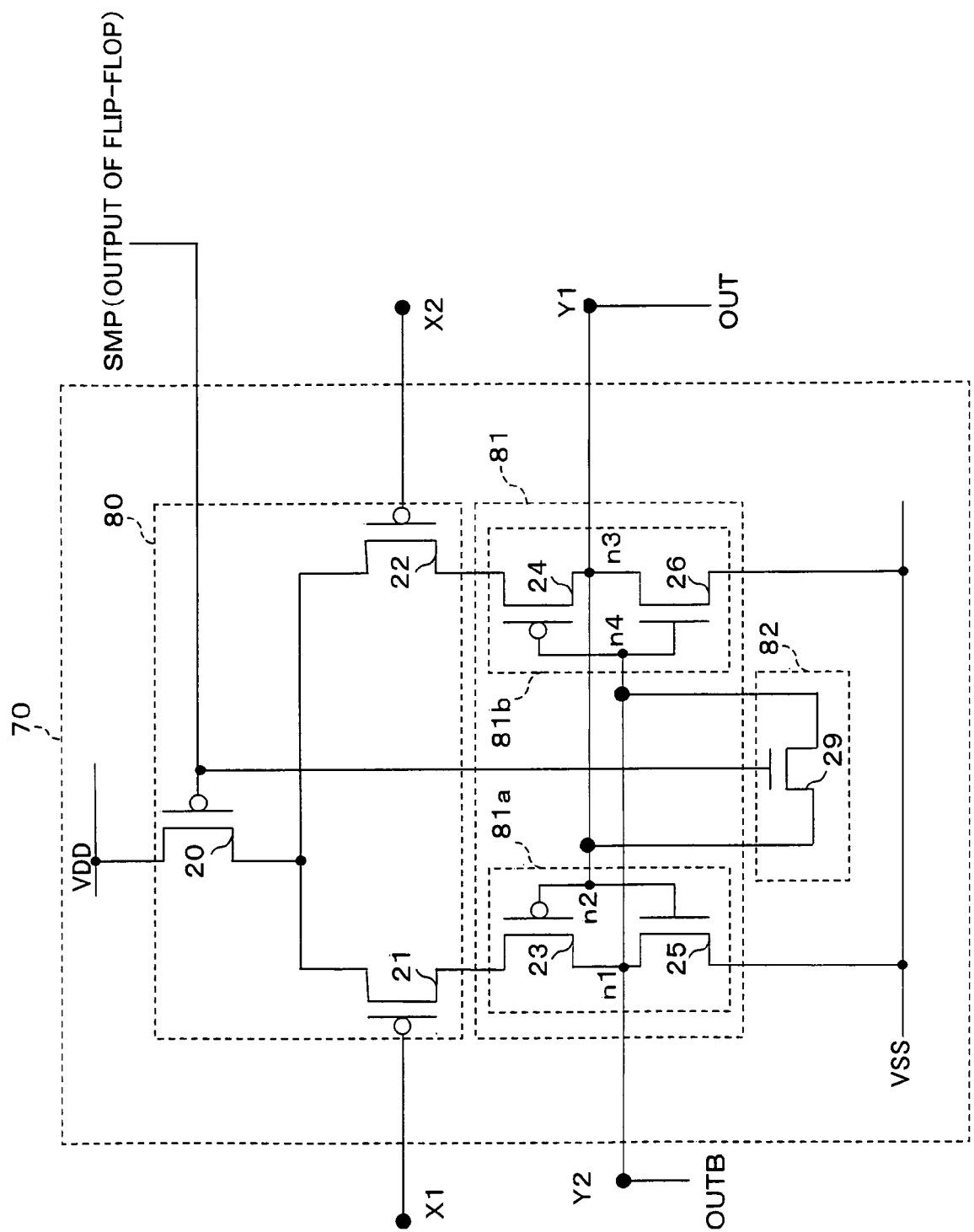
FIG. 7 is a circuit diagram illustrating a circuit configuration of the level-shifter latch circuit of the present embodiment.
Figure 8:
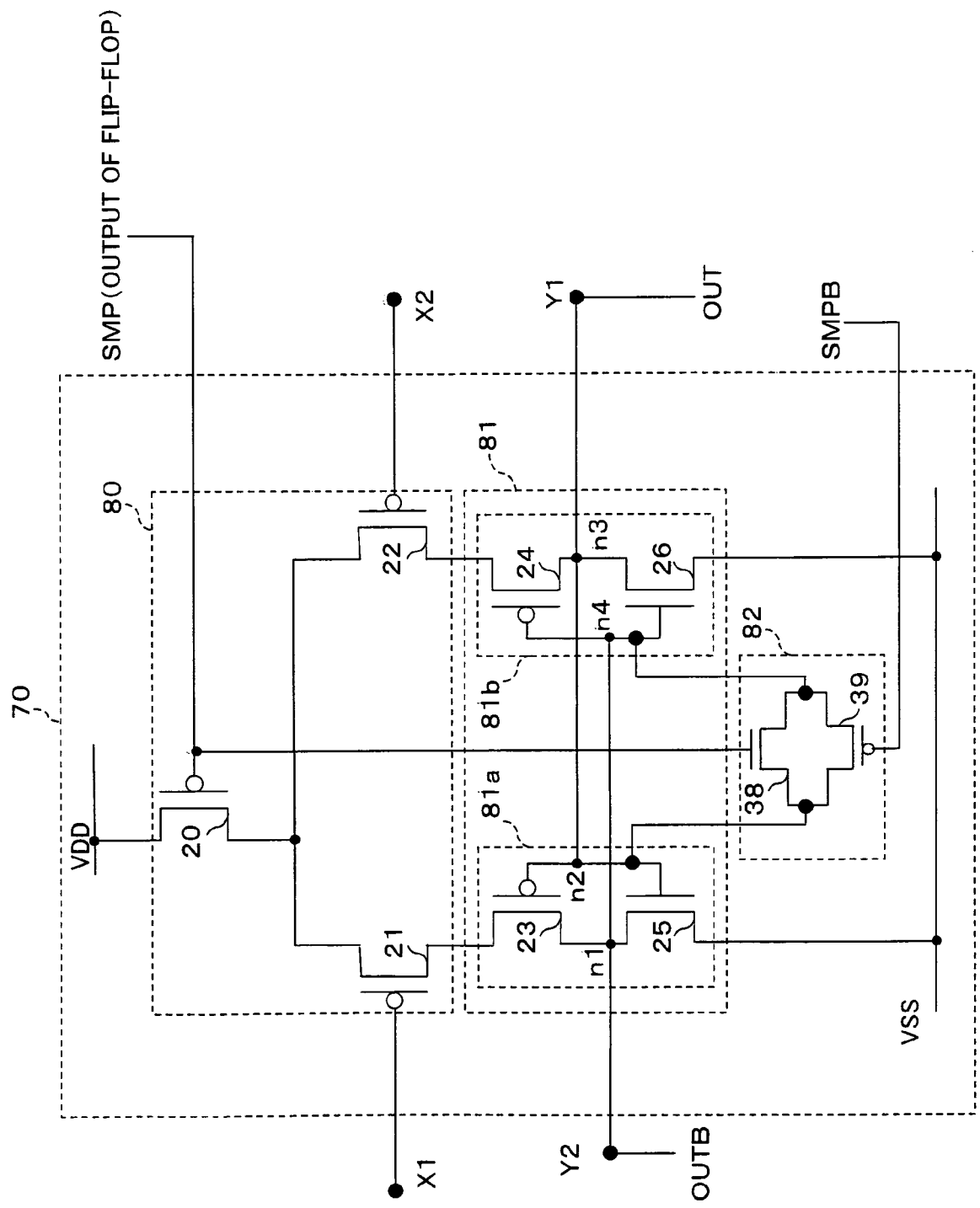
FIG. 8 is a circuit diagram illustrating a circuit configuration of the level-shifter latch circuit of the present embodiment.

Alternatively, a level-shifter latch circuit of the present embodiment may be arranged as shown in FIG. 7. That is, (i) a reset circuit 82 is realized by a single N-channel MOS transistor 29, (ii) two continuity terminals of the N-channel MOS transistor 29 are connected to nodes n2 and n4, respectively; and (iii) a control terminal (a gate) is connected to an output of a flip-flop (SMP). Alternatively, a level-shifter latch circuit of the present embodiment may be arranged as shown in FIG. 8. That is, (i) a reset circuit 82 is realized by an N-channel MOS transistor 38 and a P-channel MOS transistor 39; (ii) two continuity terminals of the N-channel MOS transistor 38 are connected to nodes n2 and n4, respectively; (iii) a control terminal (a gate) is connected to an output of a flip-flop (SMP); (iv) two continuity terminals of the P-channel MOS transistor 39 are connected to the nodes n2 and n4, respectively; and (v) a control terminal (a gate) is connected to an inversion output (SMPB) of the flip-flop. Arrangements other than specified above are the same as those shown in FIG. 1. With the arrangement, it is possible to carry out a reset operation by short-circuiting the input terminals (n2 and n4) of a first and second CMOS inverter circuit 81a and 81b. In this case, signals to be supplied to a first input terminal X1 and a second input terminal X2 are the same as those shown in FIG. 2 or FIG. 3. For example, when an IN (a first input signal) and an INB (a second input signal) shown in FIG. 14 are supplied, output signals indicated by OUT and OUTB in FIG. 14 are generated at first and second output terminals Y1 and Y2, respectively, thereby allowing the input signal to be level-shifted and latched of the input signals. Furthermore, as shown in FIG. 14, a current is applied only at beginning and ending of the level shift (at the time when the "H"/"L" of the SMP is changed), thereby allowing a reduction in power consumption.

Figure 5:
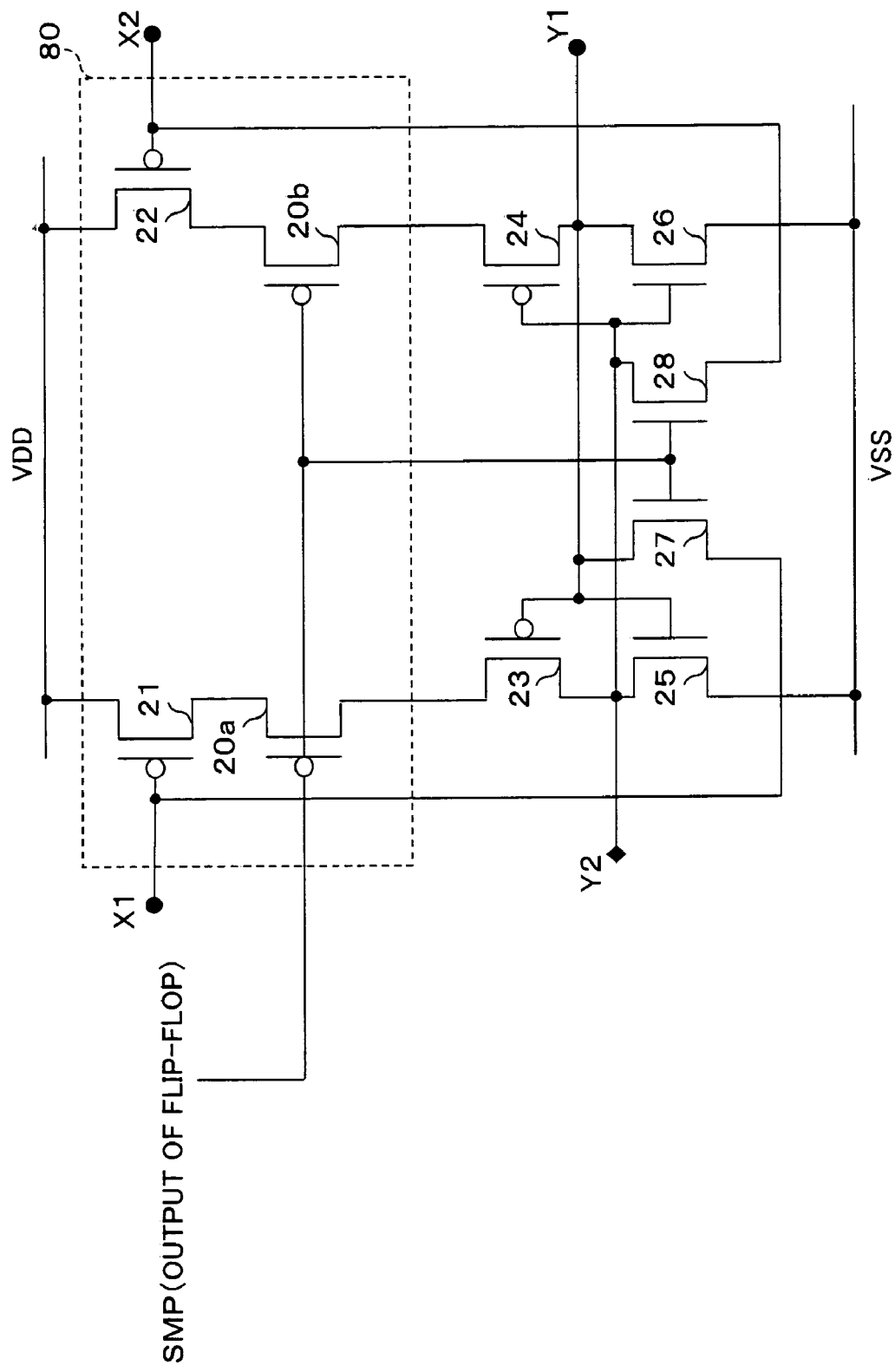
FIG. 5 is a circuit diagram illustrating a circuit configuration of the level-shifter latch circuit of the present embodiment.

Alternatively, a level-shifter latch circuit of the present embodiment may be arranged as shown in FIG. 5. That is, in a current control circuit 80, a source of a transistor 21 is connected to VDD; a drain of the transistor 21 is connected to a source of a transistor 20a (P-channel); and a drain of the transistor 20a is connected to a source of a transistor 23, while a source of a transistor 22 is connected to VDD; a drain of the transistor 21 is connected to a source of a transistor 20b (P-channel); and a drain of the transistor 20b is connected to a source of a transistor 24. Gates of the transistors 20a and 20b are connected to outputs of a flip-flop. Arrangements other than described above are the same as those shown in FIG. 1. Note that a reset circuit 82 may also be arranged as shown in FIG. 4 or FIG. 7.

Figure 6:
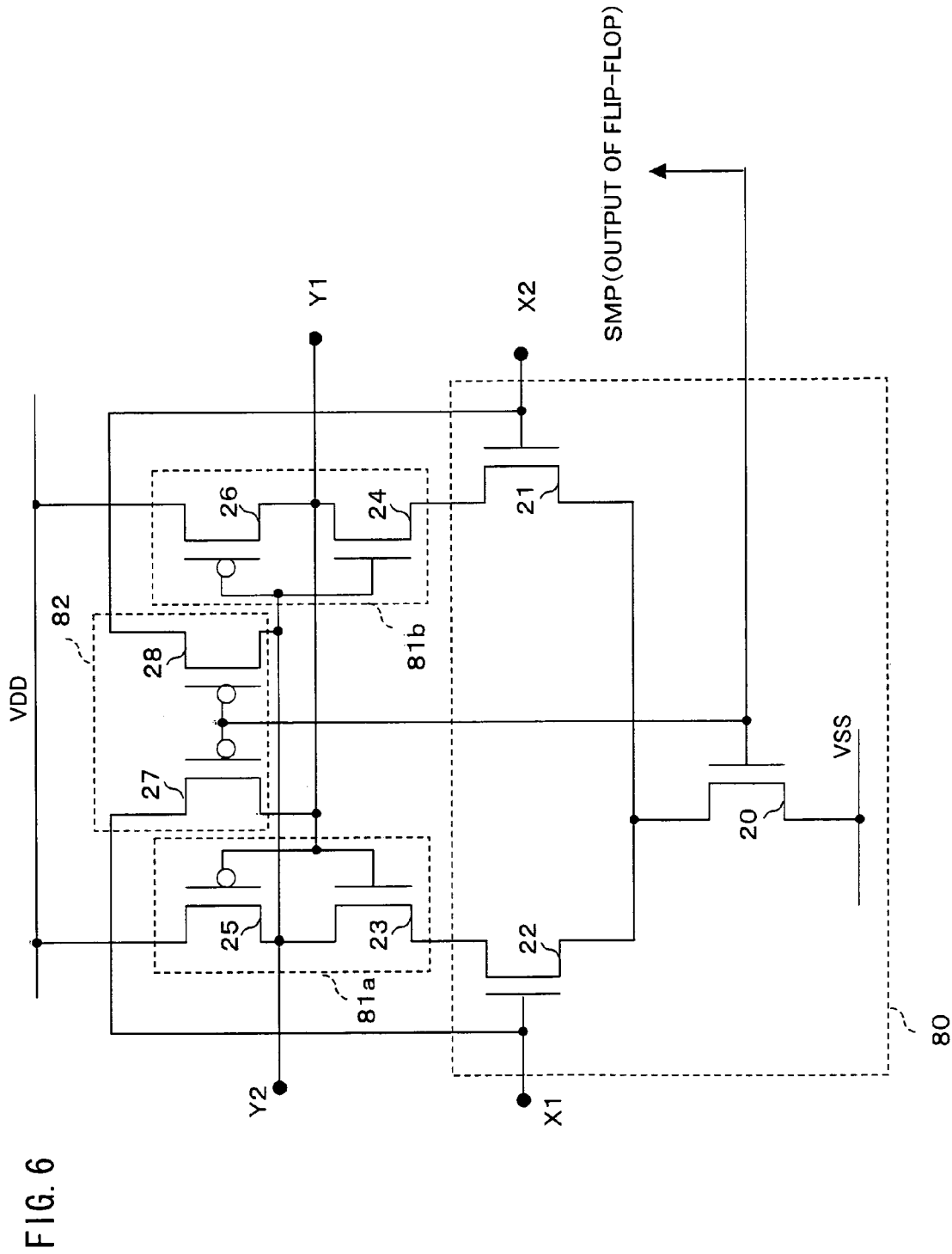
FIG. 6 is a circuit diagram illustrating a circuit configuration of the level-shifter latch circuit of the present embodiment.
Figure 12:
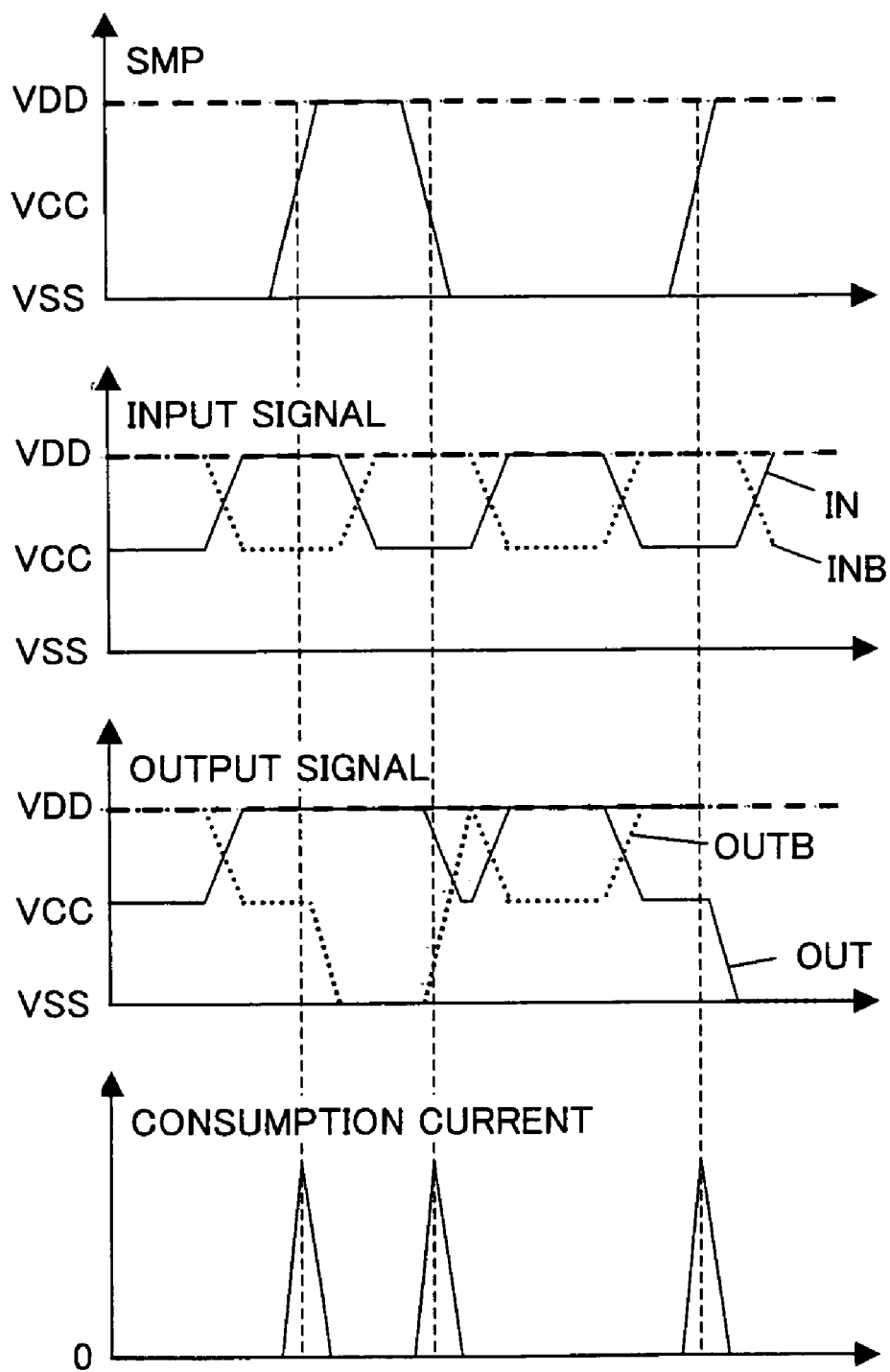
FIG. 12 is a timing chart describing how the level-shifter latch circuit in FIG. 6 operates.

Alternatively, a level-shifter latch circuit of the present embodiment may be arranged as shown in FIG. 6. That is, a current control circuit 80 is realized by three N-channel MOS transistors 20, 21 and 22; a cross-coupled inverter circuit 81 is realized by (i) two N-channel MOS transistors 23 and 24 and (ii) two P-channel MOS transistors 25 and 26; and a reset circuit 82 is realized by P-channel MOS transistors 27 and 28. A source of the transistor 20 is connected to VSS and drains of the transistors 25 and 26 are connected to VDD. Connection relations other than described above are as described in FIG. 1. As such, for example, when an IN (a first input signal) and an INB (a second input signal) shown in FIG. 12 are supplied to a first input terminal X1 and a second input terminal X2, respectively, signals indicated by OUT and OUTB in FIG. 12 are generated at first and second output terminals Y1 and Y2, respectively, thereby allowing the input signals to be level-shifted and latched. Besides, as shown in FIG. 12, a current is applied only at beginning and ending of the level-shift (at the time when the "H"/"L" of the SMP is changed), thereby allowing a reduction in power consumption. Alternatively, a reset circuit 82 may also arranged as shown in FIG. 4 (note however that transistors 27 and 28 are assumed to be P-channels and to be connected to VDD) or may be arranged as shown in FIG. 7 (note however that the transistor 29 is assumed to be a P-channel).

INDUSTRIAL APPLICABILITY

A signal process circuit and a level-shifter in accordance with the present invention are suitable for source drivers (in particular, digital drivers) in a device such as a liquid crystal display device.

The invention claimed is:

1. A signal process circuit, comprising:
a first input terminal via which an input signal is supplied;
a second input terminal via which a predetermined signal is supplied;
a cross-coupled inverter circuit, including first and second CMOS inverter circuits, in which (i) an input of the first CMOS inverter circuit and an output of the second CMOS inverter circuit are interconnected to each other and (ii) an output of the first CMOS inverter circuit and an input of the second CMOS inverter circuit are interconnected to each other;
an output terminal connected to one of the output of the first CMOS inverter circuit and the output of the second CMOS inverter circuit;
a current control circuit configured to apply current to the first and second CMOS inverter circuits in accordance with a timing signal, the input signal, and the predetermined signal; and
a reset circuit configured to connect the output terminal to the first input terminal in response to the timing signal.

2. The signal process circuit as set forth in claim 1, wherein:
the current control circuit is connected to a first power source and the cross-coupled inverter circuit, and
the cross-coupled inverter circuit is connected to a second power source and the reset circuit.

3. The signal process circuit as set forth in claim 2, wherein the current control circuit includes a switch transistor including a control terminal via which the timing signal is input, a first current control transistor including a control terminal via which the input signal is input, and a second current control transistor including a control terminal via which the predetermined signal is input,
the first CMOS inverter circuit is connected to the first power source via the switch transistor and the first current control transistor, and
the second CMOS inverter circuit is connected to the first power source via the switch transistor and the second current control transistor.

4. The signal process circuit as set forth in claim 3, wherein:
the reset circuit includes a reset transistor including a control terminal via which the timing signal is input,
the output terminal is connected to the first input terminal via the reset transistor, and
the reset transistor is turned ON while the switch transistor is turned OFF.

5. The signal process circuit as set forth in claim 1, wherein:
the predetermined signal is an inversion signal of the input signal.

6. The signal process circuit as set forth in claim 1, wherein:
the predetermined signal is a constant electric potential signal that is larger than a ground electric potential and smaller than a threshold electric potential of an N-channel MOS transistor that is part of the cross-coupled inverter circuit.

7. The signal process circuit as set forth in claim 1, wherein:
the predetermined signal is a constant electric potential signal that is larger than a ground electric potential and smaller than a maximum value of an electric potential of the input signal.

8. The signal process circuit as set forth in claim 2, wherein:
the predetermined signal is a constant electric potential signal that is equal to an electric potential of the second power source.

9. The signal process circuit as set forth in claim 4, wherein:
the first power source is a high electric potential side power source,
the second power source is a low electric potential side power source,
each of the first and second current control transistors and the switch transistor is a P-channel MOS transistor, and
the reset transistor is an N-channel MOS transistor.

10. The signal process circuit as set forth in claim 4, wherein:
the first power source is a low electric potential side power source,
the second power source is a high electric potential side power source,
each of the first and second current control transistors and the switch transistor is a N-channel MOS transistor, and
the reset transistor is a P-channel MOS transistor.

11. The signal process circuit as set forth in claim 9, wherein:
the input signal has (i) a minimum value in electric potential that is equal to an electric potential of the second power source and (ii) a maximum value in electric potential that is smaller than a threshold electric potential of an N-channel MOS transistor that is part of the cross-coupled inverter circuit.

12. The signal process circuit as set forth in claim 9, wherein:
the predetermined signal is a constant electric potential signal that is larger than an electric potential of the second power source and smaller than a threshold electric potential of an N-channel MOS transistor that is part of the cross-coupled inverter circuit.

13. The signal process circuit as set forth in claim 4, wherein:
a channel size of the first current control transistor is different from a channel size of the second current control transistor,
a logical threshold level of the first CMOS inverter circuit is different from a logical threshold level of the second CMOS inverter circuit; and
the predetermined signal is a constant electric potential signal that is equal to an electric potential of the second power source.

14. A display driver circuit, comprising:
the signal process circuit as set forth in claim 1, the signal process circuit configured to serve as a combination of a flip-flop and a latch circuit, the flip-flop configured to output a timing signal.

15. The display panel driver circuit as set forth in claim 14, wherein:
the input signal is one bit of digital image signal.

16. A display device, comprising:
the display panel driver circuit as set forth in claim 15; and
a display panel connected to the display panel driver circuit.

17. The display device as set forth in claim 16, wherein:
the display panel driver circuit and the display panel are monolithically formed.

* * * * *